US007989782B2

(12) United States Patent
Tomimatsu et al.

(10) Patent No.: US 7,989,782 B2
(45) Date of Patent: Aug. 2, 2011

(54) APPARATUS AND METHOD FOR SPECIMEN FABRICATION

(75) Inventors: Satoshi Tomimatsu, Kokubunji (JP); Miyuki Takahashi, Hino (JP); Hiroyasu Shichi, Tokyo (JP); Muneyuki Fukuda, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 263 days.

(21) Appl. No.: 12/354,153

(22) Filed: Jan. 15, 2009

(65) Prior Publication Data
US 2009/0121158 A1    May 14, 2009

Related U.S. Application Data

(63) Continuation of application No. 11/441,016, filed on May 26, 2006, now Pat. No. 7,482,603.

(30) Foreign Application Priority Data

May 27, 2005  (JP) ................................. 2005-154875

(51) Int. Cl.
*G21G 5/00*   (2006.01)
(52) U.S. Cl. .................. 250/492.2; 250/492.1; 250/307; 250/309; 250/310; 250/311
(58) Field of Classification Search .................... None
See application file for complete search history.

(56) References Cited

U.S. PATENT DOCUMENTS

| | | | |
|---|---|---|---|
| 5,872,061 A | 2/1999 | Lee et al. | |
| 6,042,738 A * | 3/2000 | Casey et al. | 430/5 |
| 6,120,697 A * | 9/2000 | Demmin et al. | 252/79.4 |
| 6,211,527 B1 * | 4/2001 | Chandler | 250/492.2 |
| 6,268,608 B1 | 7/2001 | Chandler | |
| 6,538,254 B1 * | 3/2003 | Tomimatsu et al. | 250/442.11 |
| 6,570,170 B2 * | 5/2003 | Moore | 250/492.21 |
| 6,629,348 B2 * | 10/2003 | Skorupski et al. | 29/246 |
| 6,710,338 B2 | 3/2004 | Gerlach et al. | |
| 6,727,178 B2 * | 4/2004 | Saitou et al. | 438/688 |
| 6,800,210 B2 * | 10/2004 | Patel et al. | 216/2 |
| 6,828,566 B2 * | 12/2004 | Tomimatsu et al. | 250/442.11 |
| 6,843,927 B2 * | 1/2005 | Naser-Ghodsi | 216/84 |
| 6,881,955 B2 * | 4/2005 | Lu et al. | 250/307 |

(Continued)

FOREIGN PATENT DOCUMENTS
JP       02240198 A  *  9/1990
(Continued)

*Primary Examiner* — Robert Kim
*Assistant Examiner* — Michael J Logie
(74) *Attorney, Agent, or Firm* — Mattingly & Malur, PC

(57) ABSTRACT

A specimen fabricating apparatus comprises: a specimen stage, on which a specimen is placed; a charged particle beam optical system to irradiate a charged particle beam on the specimen; an etchant material supplying source to supply an etchant material, which contains fluorine and carbon in molecules thereof, does not contain oxygen in molecules thereof, and is solid or liquid in a standard state; and a vacuum chamber to house therein the specimen stage. A specimen fabricating method comprises the steps of: processing a hole in the vicinity of a requested region of a specimen by means of irradiation of a charged particle beam; exposing the requested region by means of irradiation of the charged particle beam; supplying an etchant material, which contains fluorine and carbon in molecules thereof, does not contain oxygen in molecules thereof, and is solid or liquid in a standard state, to the requested region as exposed; and irradiating the charged particle beam on the requested region as exposed.

17 Claims, 18 Drawing Sheets

U.S. PATENT DOCUMENTS

| | | | |
|---|---|---|---|
| 6,888,136 B2* | 5/2005 | Geurts et al. | 250/307 |
| 7,015,483 B2* | 3/2006 | Suzuki et al. | 250/311 |
| 7,041,224 B2* | 5/2006 | Patel et al. | 216/2 |
| 7,095,021 B2* | 8/2006 | Shichi et al. | 250/307 |
| 7,176,458 B2* | 2/2007 | Tomimatsu et al. | 250/306 |
| 7,189,332 B2* | 3/2007 | Patel et al. | 216/2 |
| 7,326,445 B2* | 2/2008 | Kaito | 427/585 |
| 7,397,051 B2* | 7/2008 | Tomimatsu et al. | 250/492.21 |
| 7,482,603 B2* | 1/2009 | Tomimatsu et al. | 250/492.2 |
| 2002/0166976 A1* | 11/2002 | Sugaya et al. | 250/440.11 |
| 2003/0000921 A1* | 1/2003 | Liang et al. | 216/59 |
| 2003/0098288 A1 | 5/2003 | Mori et al. | |
| 2003/0183776 A1* | 10/2003 | Tomimatsu et al. | 250/442.11 |
| 2005/0045276 A1* | 3/2005 | Patel et al. | 156/345.43 |
| 2005/0066899 A1* | 3/2005 | Fukuda et al. | 118/723 FI |
| 2007/0145301 A1* | 6/2007 | Tomimatsu et al. | 250/492.21 |
| 2007/0293644 A1* | 12/2007 | Morikawa et al. | 526/247 |
| 2008/0035607 A1* | 2/2008 | O'Hara et al. | 216/63 |

FOREIGN PATENT DOCUMENTS

| | | |
|---|---|---|
| JP | 3216881 | 8/2001 |
| JP | 3350374 | 9/2002 |
| JP | 2005-17298 A | 1/2005 |

* cited by examiner

APPARATUS AND METHOD FOR SPECIMEN FABRICATION

CROSS-REFERENCES

This is a continuation application of U.S. Ser. No. 11/441,016, filed May 26, 2006 (now U.S. Pat. No. 7,482,603), which claims priority from Japanese Application No. 2005-154875 filed on May 27, 2005. The entire disclosures of all of the above-identified applications are hereby incorporated by reference.

BACKGROUND OF THE INVENTION

The present invention relates to an apparatus and a method of fabricating a specimen for observation of a structure, which is used to observe a cross sectional shape of a device or the like.

There have been increased needs for examination and analysis of semiconductor devices, for which miniaturization is going to progress. In a failure analysis, which specifies the cause of failure, among the needs, it is an essential technology to directly observe a defect inside a device. Method of observing a section is shown in FIGS. 2A and 2B. In the beginning, focused ion beam (referred below to as FIB) 201 is used to process a rectangular hole 202, of which one side defines a position being requested for section observation. One side of the hole formed thereby defines a requested section 203, and the section is observed by a scanning electron microscope (referred below to as SEM). Since the section is formed by irradiating FIB 201 in parallel to the requested section, the section formed by FIB is essentially flat. On the other hand, SEM used for observation irradiates primary electrons in a position of observation and imaging, as contrast, the number of secondary electrons (or reflected electrons) generated from the position to thereby form an image to be observed. While the number of secondary electrons depends upon material of an object, it depends upon an irregular shape further than that. That is, since an observation section 203 formed by FIB is flat as described above and little irregular in shape, a difference in SEM image contrast consists of only a difference in secondary-electron yield attributable to a material. However, only a difference, in secondary-electron yield, attributable to a material is insufficient for that observation of a minute structure, the necessity of which has been increased in recent years, and so there is caused a problem that the image resolution is insufficient.

Therefore, it is desirable to emphasize a contrast difference attributable to a structure. As measures for realizing this, there is used decoration of profile by forming irregularities every material of a structure. In SEM, when irregularities are present, boundaries of raised portions are observed to be bright since edges become large in secondary-electron yield, so that observation in high contrast is made possible. In order to provide for a difference in level every structure, a difference in processing sputtering yield, attributable to a material, is made use of. In case of FIB, since a difference in sputtering yield, attributable to a material, is present also in physical sputtering, irregularities 301, 302, 303 every material can be formed as shown in FIGS. 3A and 3B by irradiating FIB not in parallel to a section but obliquely at a certain angle to a section. FIG. 3B shows a section when a section indicated by a broken line in FIG. 3A is viewed along an arrow 304, and a left side thereof defines an outermost surface. For example, structures 301, 303 are made of Si and a structure 302 is made of $SiO_2$. Here, the reason why FIB is irradiated obliquely is that since a section is defined by a side of a processed hole, irradiation perpendicular to the section is impossible. Since a difference in sputtering yield, attributable to a material, is relatively small, however, an intense processing on a section is needed to form sufficient irregularities by physical sputtering with FIB, which causes a problem in terms of damage.

Therefore, methods of efficiently forming irregularities depending upon a material include a processing making use of chemical reaction. For example, Japanese Patent No. 3216881 indicates that irregularities due to differences in sputtering rate can be formed by performing a FIB processing while making fluorine-containing gases flow to a processed sample. Japanese Patent No. 3350374 discloses FIB assist-etchant measures, in which halogenated gases and halogenated hydrocarbon gases such as $Cl_2$, $XeF_2$, $CF_4$, $CHF_4$, $C_2F_6$, $C_3F_8$, $C_4F_8$, etc. are used as etch-assisting gases. U.S. Pat. No. 6,211,527 discloses measures to realize decoration of a section by means of FIB assist-etchant, in which halogenated hydrocarbon gases are used as etch-assisting gases.

By performing FIB assist-etchant with the use of etch-assisting gases as in the related art, it is possible to vary a processing speed every material. As described above, a difference in level of irregularities is important in order to provide for a difference in contrast in SEM observation. However, an excessive processing with a view to forming a difference in contrast is not desirable. The reason for this is a fear that in case of FIB, since the presence of irregularities brings about an increase in sputtering rate at edge portions, the edge portions get out of shape to look differently in SEM observation from an original structure of a section. Further, digging much by means of FIB in order to provide for a difference in level means that a structural profile different from a section being essentially observed is observed in a device, which is varied in structure in a depthwise direction. Therefore, it is desirable to make an amount of processing as small as possible to form a necessary difference in level.

Gases adopted in Japanese Patent Nos. 3216881 and 3350374 are in essence gaseous in a standard state. The standard state means 1 barometric pressure and 25° C. Essentially, these gases are those used in plasma etchant. In case of plasma etchant, gases themselves are ionized as plasma and ionized molecules are accelerated by plasma sheath formed on a surface of a sample, being a target of processing, to be irradiated on a surface of the sample, thereby performing etchant. However, FIB assist-etchant is different in reaction configuration in the following manner. Etch-assisting gases as supplied are first adsorbed by a sample surface. FIB is irradiated on the sample surface to inject energy thereinto to give thereto a reaction energy for reaction of a constituent material of a sample with gases, thereby generating a chemical reaction to subject a material of the sample to etchant. Therefore, in order to adequately cause the reaction, it is required that gases be sufficiently adsorbed by the sample surface. However, the probability that the gases being originally gaseous at room temperature are physically adsorbed by the sample surface is small as compared with a substance being originally solid, so that it is difficult to ensure a sufficient adsorbed amount. That is, gases used in plasma etchant is not necessarily suited to FIB etch-assisting gases.

Further, a material accounting for a large part of a semiconductor device comprises silicon (Si) being a substrate material and an oxide silicon ($SiO_2$, etc.) being an insulating material. While it is desirable to form a difference in level between Si and $SiO_2$, the reason why the CF gases are used is as follows. Si reacts chemically with F to generate volatile $SiF_4$ or the like to be etched. In this case, however, C remains whereby a substance, such as SiC, etc., being hard to be etched is formed to suppress etchant. On the other hand, with $SiO_2$, Si volatilizes as $SiF_4$ or the like as described above and C also reacts with O to volatilize as $CO_2$ or the like, so that etchant is not suppressed like Si. Thereby, Si and $SiO_2$ are varied in sputtering rate, so that it becomes possible to create a difference in level. CF gases, such as CO, COOH, etc., which contain O, are adopted in the U.S. Pat. No. 6,211,527. While SiC serves to suppress Si etchant in the reaction, O contained in etchant gases involves a fear that such suppressing effect is decreased. Therefore, there are needed an apparatus and a method of fabricating a section, in which the problems are solved, an effective difference in etchant is ensured, and a requested difference in level is fabricated in less processing to enable realizing a high contrast observation with SEM.

SUMMARY OF THE INVENTION

In order to solve such problems, the invention provides a specimen fabricating apparatus and a specimen fabricating method described below.

A specimen fabricating apparatus according to the invention comprises a movable specimen stage, on which a specimen is placed, a charged particle beam optical system that irradiates a charged particle beam on the specimen, an etchant material supplying source that supplies an etchant material, which contains fluorine and carbon in molecules thereof, does not contain oxygen in molecules thereof, and is solid or liquid in a standard state (1 barometric pressure and 25° C.), and a vacuum chamber that houses therein the specimen stage. Thereby, it becomes possible to fabricate a specimen profile of which is decorated.

A specimen fabricating apparatus according to the invention comprises a movable specimen stage, on which a specimen is placed, a charged particle beam optical system that irradiates a charged particle beam on the specimen, an etchant material supplying source that supplies an etchant material, in molecules of which a ratio of fluorine to carbon in number is 2 or more and which is solid or liquid in a standard state (1 barometric pressure and 25° C.), to the specimen, and a vacuum chamber that houses therein the specimen stage. Thereby, since a further difference in sputter rate can be ensured, it becomes possible to effectively fabricate a specimen profile of which is decorated.

A specimen fabricating method according to the invention comprises the steps of processing a hole in the vicinity of a requested region of a specimen by means of irradiation of charged particle beam, exposing the requested region by means of irradiation of charged particle beam, supplying an etchant material, which contains fluorine and carbon in molecules thereof, does not contain oxygen in molecules thereof, and is solid or liquid in a standard state (1 barometric pressure and 25° C.), to the requested region as exposed, and irradiating a charged particle beam on the requested region as exposed. Thereby, it is possible to realize fabrication of a specimen profile of which is decorated.

A specimen fabricating method according to the invention comprises the steps of processing a hole in the vicinity of a requested region of a specimen by means of irradiation of charged particle beam, exposing the requested region by means of irradiation of charged particle beam, supplying an etchant material, in molecules of which a ratio of fluorine to carbon in number is 2 or more and which is solid or liquid in a standard state (1 barometric pressure and 25° C.), to the specimen, and irradiating a charged particle beam on the requested region as exposed. Thereby, since a further difference in sputter rate can be ensured, it becomes possible to effectively fabricate a specimen profile of which is decorated.

According to the invention, a device section can be simply observed by means of SEM with high accuracy, so that it is possible to realize a failure analysis in a short time and to achieve an improvement in yield in semiconductor process.

Other objects, features and advantages of the invention will become apparent from the following description of the embodiments of the invention taken in conjunction with the accompanying drawings.

DETAILED DESCRIPTION OF THE INVENTION

An explanation will be given below to concrete embodiments of an apparatus for fabricating a specimen and a method of fabricating a specimen, by which beam-assisting etchant with the use of effective etch-assisting gases can be used to fabricate minute irregularities every structure on a section of a specimen for a section SEM observation.

Embodiment 1

Figure 1:
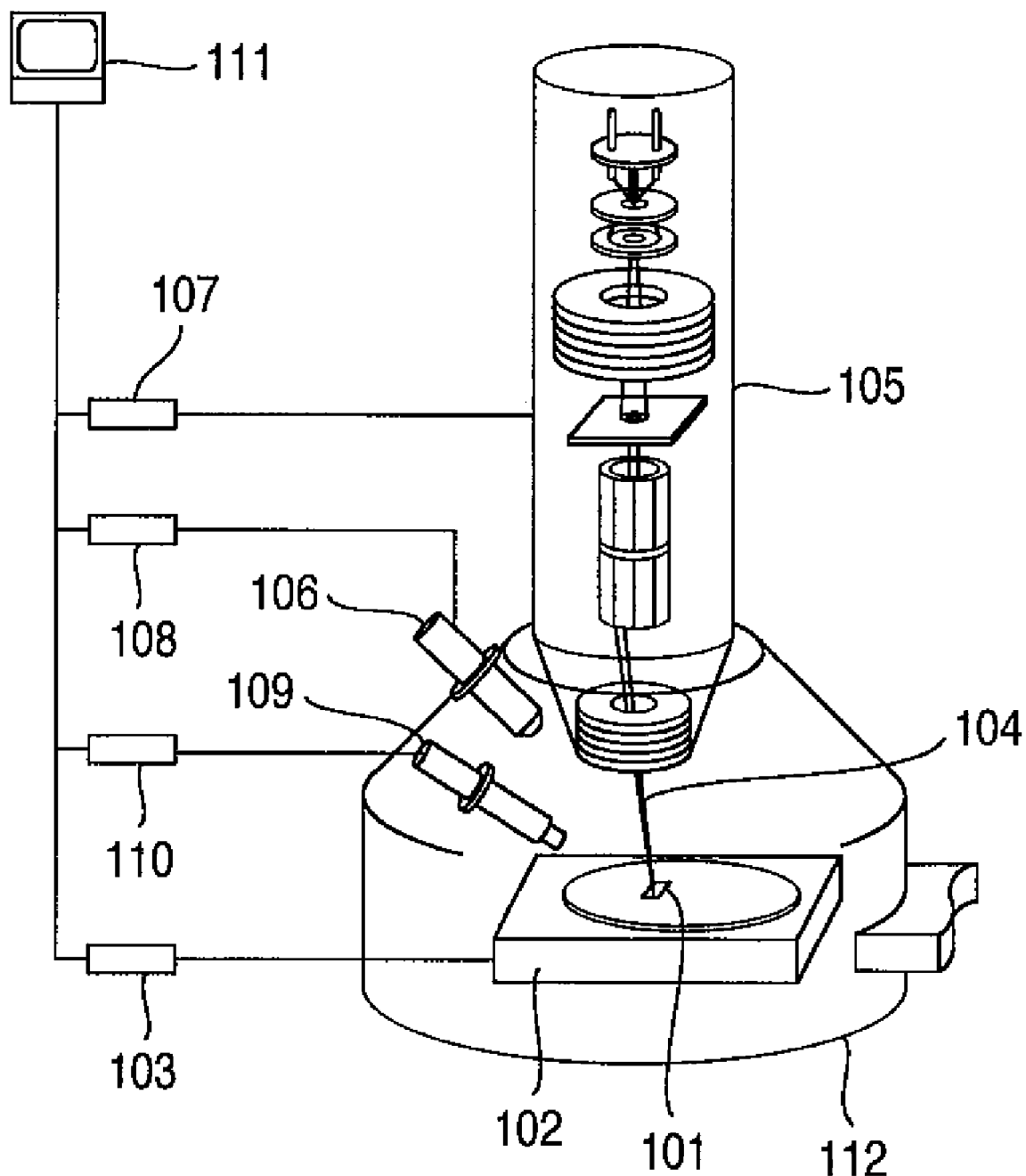
FIG. 1 is a view showing an example of a construction of a specimen fabricating apparatus according to the invention.
Figure 2A:
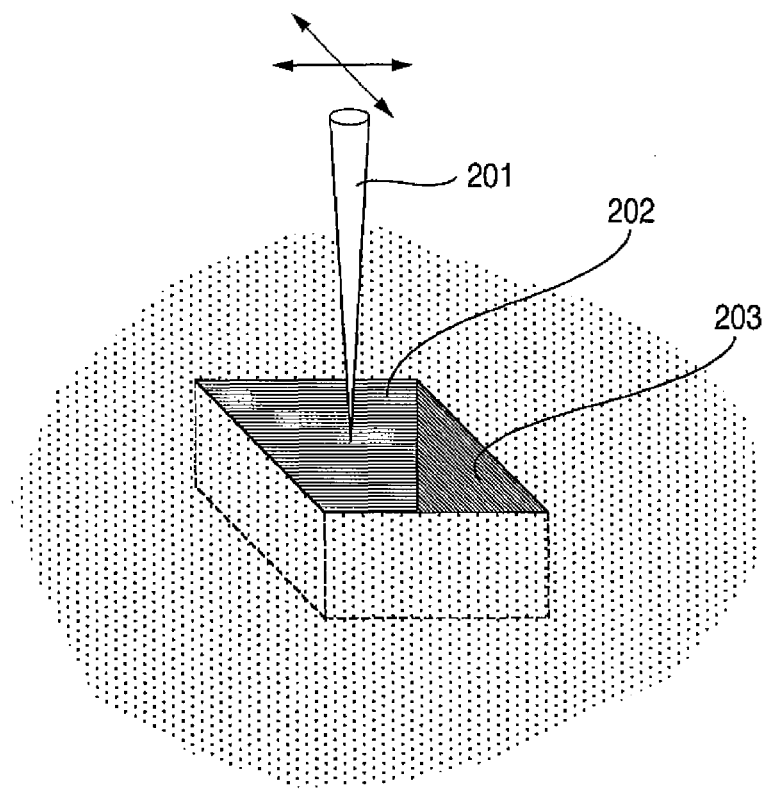
FIGS. 2A and 2B are views illustrating a method of FIB assisting etchant.
Figure 2B:
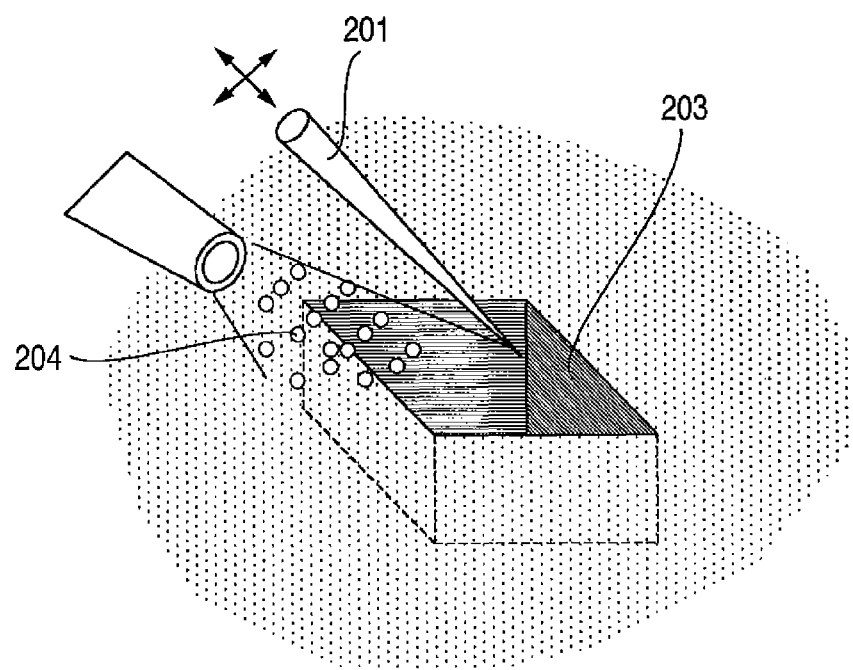
Figure 3A:
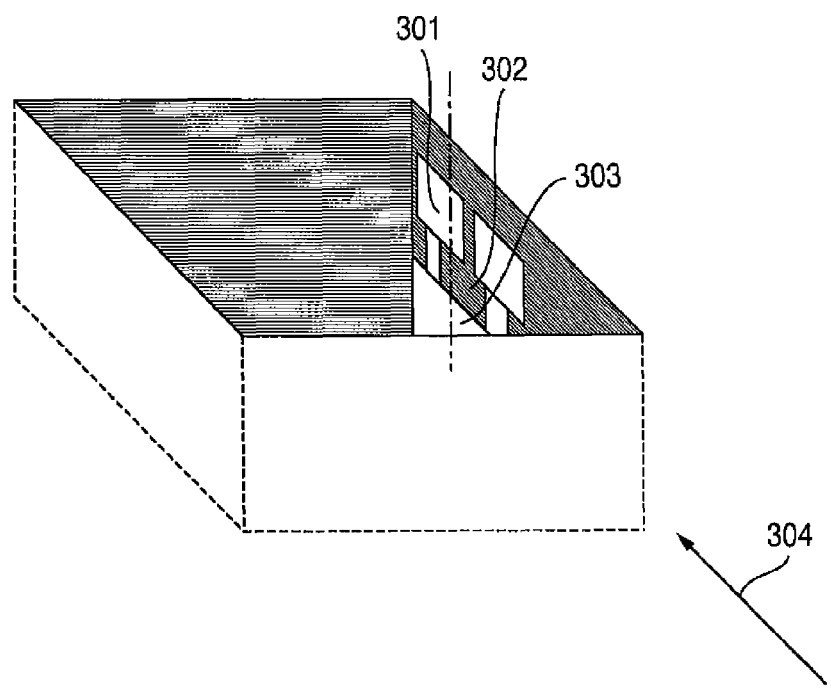
FIGS. 3A and 3B are views showing a section after an assisting etchant section processing.
Figure 3B:
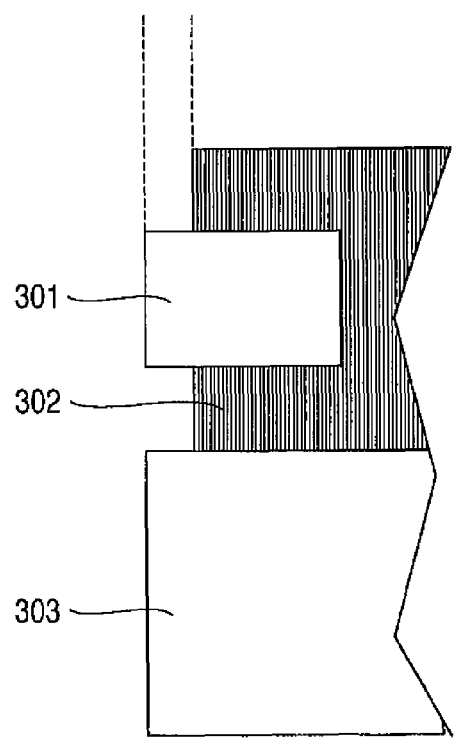

FIG. 1 shows a construction of a specimen fabricating apparatus for fabricating an observe section making use of focused ion beam. The specimen fabricating apparatus comprises a movable specimen stage 102, on which a specimen substrate such as a semiconductor wafer 101, etc. is placed, a specimen position controller 103 that controls a position of the specimen stage 102 to observe the wafer 101 and specify a position of processing, an ion-bean irradiating optical system 105 that irradiates an ion beam 104 on the wafer 101 for processing, and a secondary-electron detector 106 that detects secondary electrons emitted from the wafer 101. The ion-bean irradiating optical system 105 is controlled by a controller 107 for the ion-beam irradiating optical system, and the secondary-electron detector 106 is controlled by a controller 108 for the secondary-electron detector. An etch-assisting gas supplying source 109, which supplies an etch-assisting gas for formation of irregularities on a section every material, that is, decoration of a section, is controlled by a controller 110 for the etch-assisting gas supplying source with respect to a position thereof, heater temperature, valve opening and closing, and the like. The controller 107 for the ion-beam irradiating optical system, the controller 108 for the secondary-electron detector, the controller 110 for the etch-assisting gas supplying source, the specimen position controller 103, etc. are controlled by a central processing unit 111. The specimen stage 102, the ion-bean irradiating optical system 105, the secondary-electron detector 106, the etch-assisting gas supplying source 109, etc. are arranged in a vacuum chamber 112. Here, a specimen is a wafer, and the fact that it is possible to observe in a state of a wafer is advantageous in that it is easy to control addresses of positions, of which observation is requested, and a wafer can be transferred as it is from an examining device. However, decoration of a section is possible for a chip specimen, and so a specimen chamber and a specimen stage may be constructed so that they can be formed to be small and simple. This case is advantageous in terms of device cost since manufacture is enabled at low cost.

Figure 4:
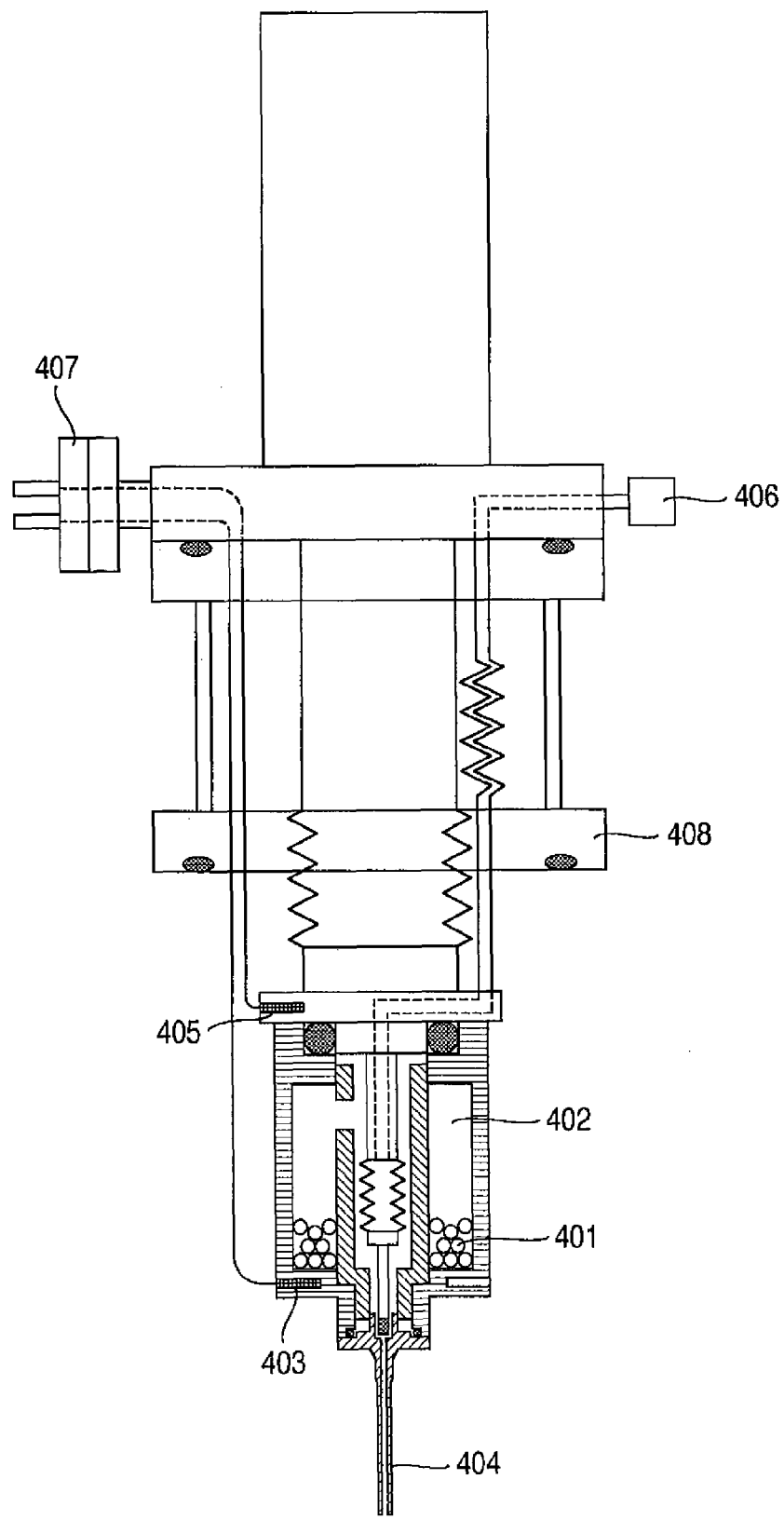
FIG. 4 is a view showing a schematic construction of an etch-assisting gas source in the invention.
Figure 5:
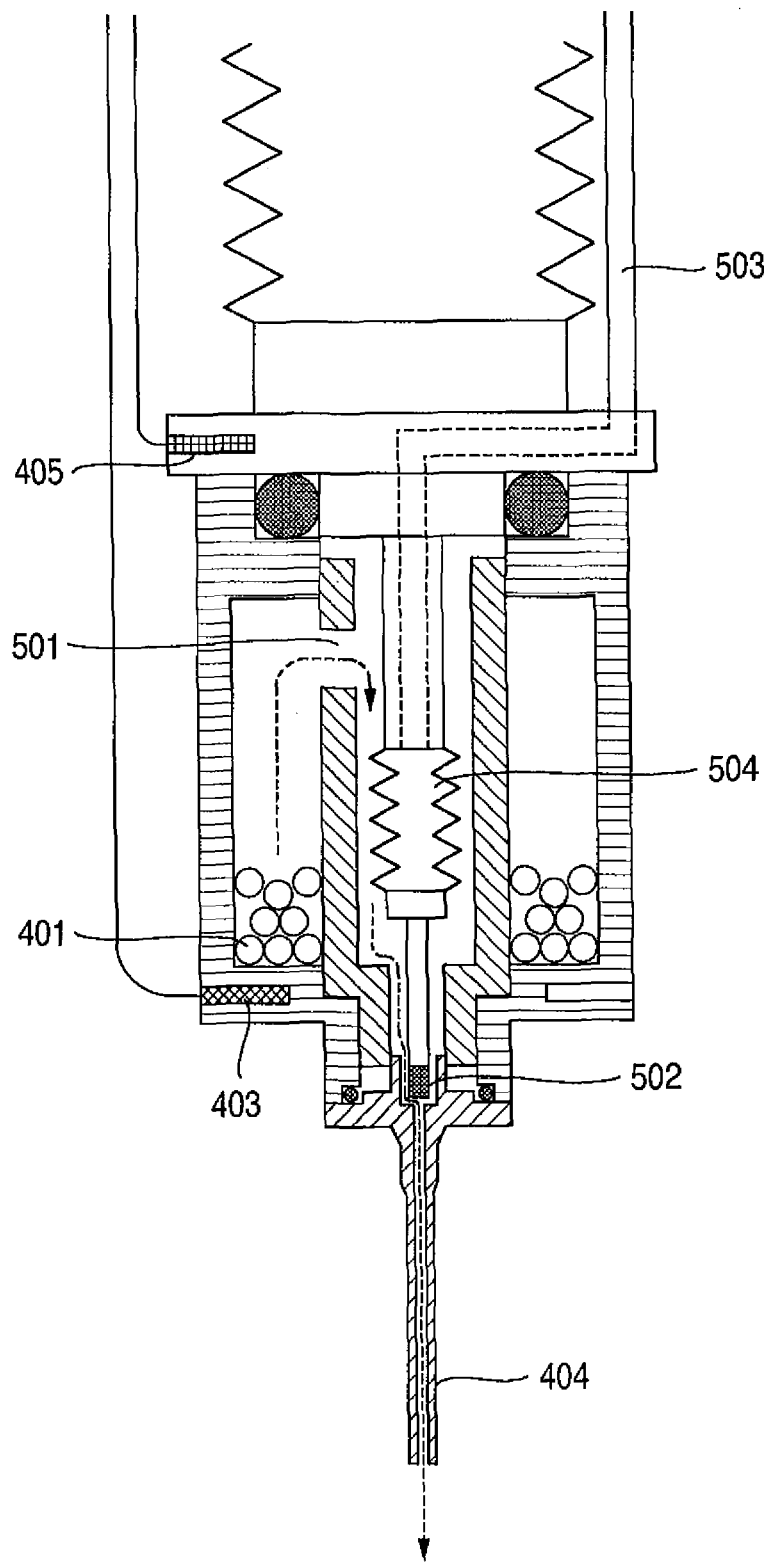
FIG. 5 is a view showing, in enlarged scale, the etch-assisting gas source.

FIG. 4 shows a schematic construction of an etch-assisting gas source. According to the embodiment, a material being solid or liquid in a standard state is used as an etch-assisting gas material 401, and so there is provided a reservoir 402 that stores an etch-assisting gas material. An etch-assisting gas material used in the embodiment comprises perfluorododecane ($F(CF_2)_{12}F$) which is solid in a standard state. A heater 403 heats an etch-assisting gas material together with the reservoir to a requested temperature. The etch-assisting gas material heated and vaporized is fed to a specimen surface from a nozzle 404. Here, flow of a gas will be described with reference to FIG. 5 which is an enlarged view. The etch-assisting gas material (perfluorododecane) 401 heated by the heater 403 vaporizes to flow toward the nozzle 404 through a supplying hole 501. A valve 502 controls ON/OFF of supplying of the gas flowing into the nozzle 404, and ON/OFF of air pressure from an air tube 503 causes extension and contraction of a bellows 504 to enable control. Gas flow rate can be controlled by heating temperature by the heater, and perfluorododecane is heated to about 35° C. in the embodiment. A thermo sensor 405 monitors temperature of the reservoir 402 to effect feedback of the same to the heater 403, thus realizing stable heating. Here, a thermocouple is used as the thermo sensor 405. An air is introduced into the air tube 503 through a connector 406 shown in FIG. 4, and communication of electric signals of the heater 403 and the thermo sensor 405 is performed through a feedthrough 407. Connection to the vacuum chamber 112 which is a specimen chamber is effected through a connection flange 408.

Here, while an explanation has been given to the case where an etch-assisting gas is solid, an etch-assisting gas material which is liquid can be likewise stored in the reservoir and heated by the heater to be vaporized and supplied. In the case where an etch-assisting gas material is liquid, however, sealing is needed to prevent the material from leaking into a gas supplying line as it is liquid, and so an etch-assisting gas material which is solid is easy in handling than the liquid. In either case, as compared with an etch-assisting gas material which is essentially gaseous, handling of an etch-assisting gas material which is solid or liquid is easy by virtue of easiness in storage and easiness in gas pressure regulation with temperature control.

Figure 6:
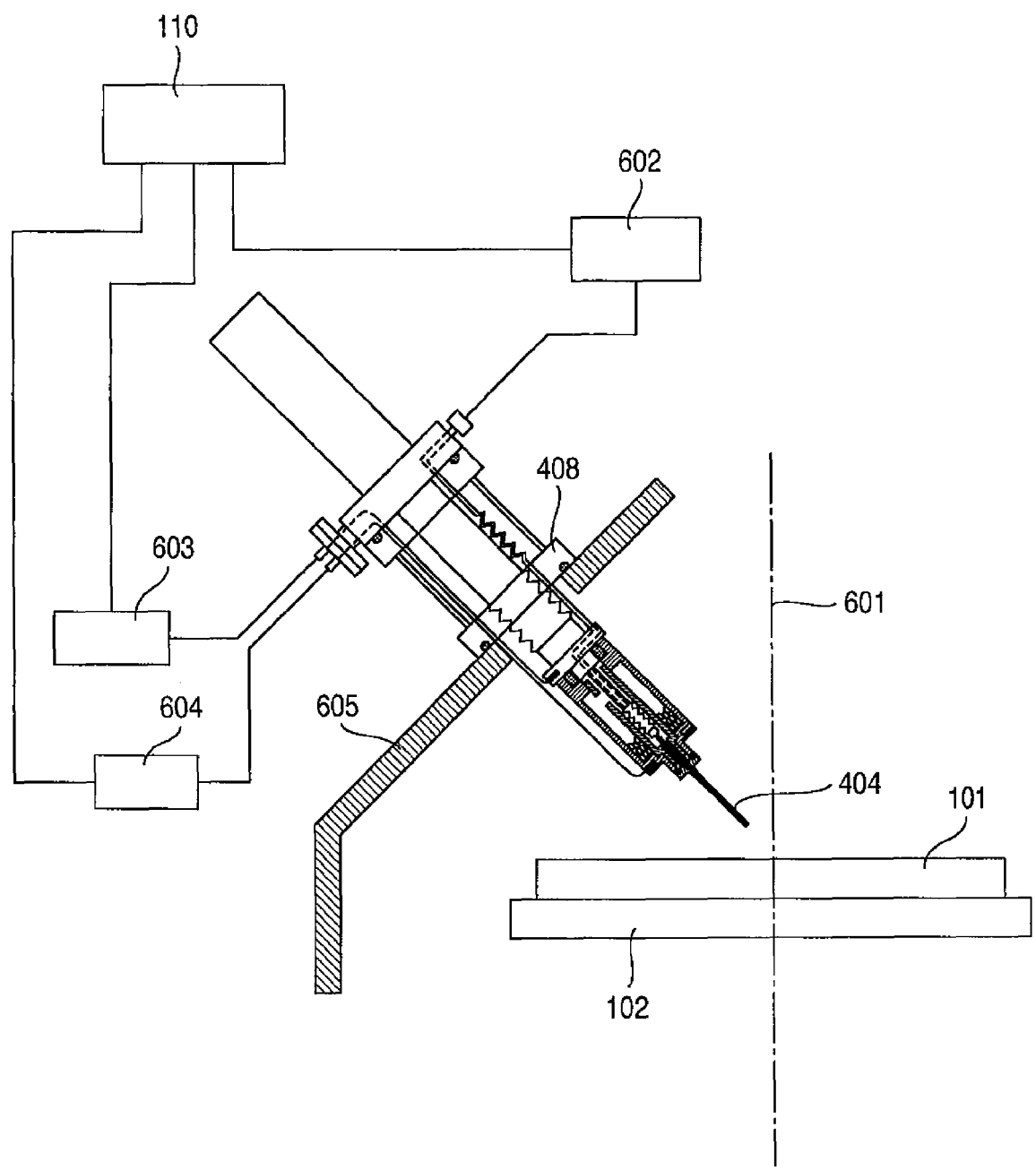
FIG. 6 is a view showing a state, in which the etch-assisting gas source is mounted to the apparatus.

FIG. 6 shows the positional relationship between connection of the etch-assisting gas supplying source 109 to the vacuum chamber 112 which is a specimen chamber and a specimen. The etch-assisting gas supplying source 109 is fixed to a vacuum chamber wall 605 by the connection flange 408 as described above. A line 601 indicates an optical axis of the ion-bean irradiating optical system 105 and an intersecting point of the optical axis and the semiconductor wafer 101 defines a processed point, so that the nozzle 404 is caused to approach the intersecting point. While an adjustment mechanism for a position of the nozzle is omitted in the drawing, adjustment mechanisms in three directions are actually provided and it is possible to adjust a position of the nozzle close to a processed point. Actually, efficient gas supplying is enabled by causing a tip end of the nozzle 404 to approach a distance of several hundreds microns to a processed point. The etch-assisting gas supplying source 109 comprises a valve controller 602 that controls an air pressure for opening and closing of the valve, a heater controller 604, and a thermo sensor controller 603, and these controllers are controlled by the controller 110 for the etch-assisting gas supplying source. While not shown, in the case where a motor is provided to control a position of the nozzle, a nozzle position controller is also controlled by the controller 110 for the etch-assisting gas supplying source.

The etch-assisting gas supplying source described above with reference to FIGS. 4 to 6 is needed to be removed from the connection flange 408 when an etch-assisting gas material is to be replenished. In case of using several kinds of etch-assisting gases to effect decoration of profile, it is troublesome to remove etch-assisting gas supplying sources one by one from the flange, so that the apparatus is decreased in operability. Further, in order to remove the etch-assisting gas supplying source from the flange, it is necessary to once open the vacuum chamber to the atmosphere, which is an obstacle to an improvement in throughput of specimen fabrication.

Figure 7:
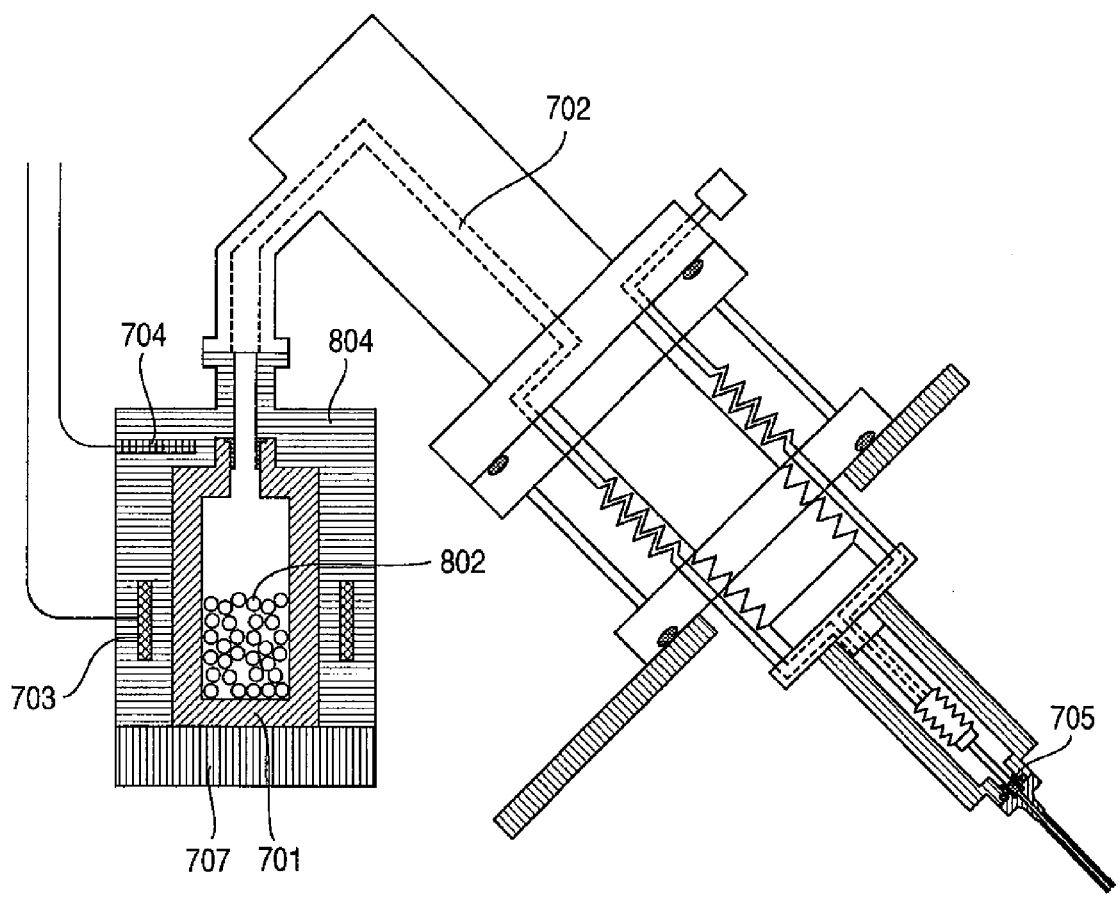
FIG. 7 is a view showing a construction of a cartridge type etch-assisting gas source.

Hereupon, an etch-assisting gas material can be readily replenished by making a system, which supplies a gas to the etch-assisting gas supplying source, a cartridge type. Details for this will be described below with reference to FIG. 7. An etch-assisting gas material 802 is stored in a cartridge 701 which is a portable type filling vessel, and the cartridge is inserted into a cartridge holder 804 to be connected to the etch-assisting gas supplying source. The cartridge holder 804 in the embodiment is cylindrical-shape with a side wall and a bottom cover 807 coupled together by a hinge. A heater 703 and a thermo sensor 704 are embedded in the cylindrical-shaped side wall and respectively connected to the heater controller 604 and the thermo sensor controller 603 through feeder lines. Therefore, connecting terminals are provided on a surface of the cartridge holder to connect the heater 703 and the thermo sensor 704, respectively, to the feeder lines. In addition, when the heater 703 is formed on an inner wall surface of the cartridge holder 804, efficiency at the time of heating the cartridge becomes higher than that with an embedded type. Further, a heater may be embedded in a cartridge.

Figure 8:
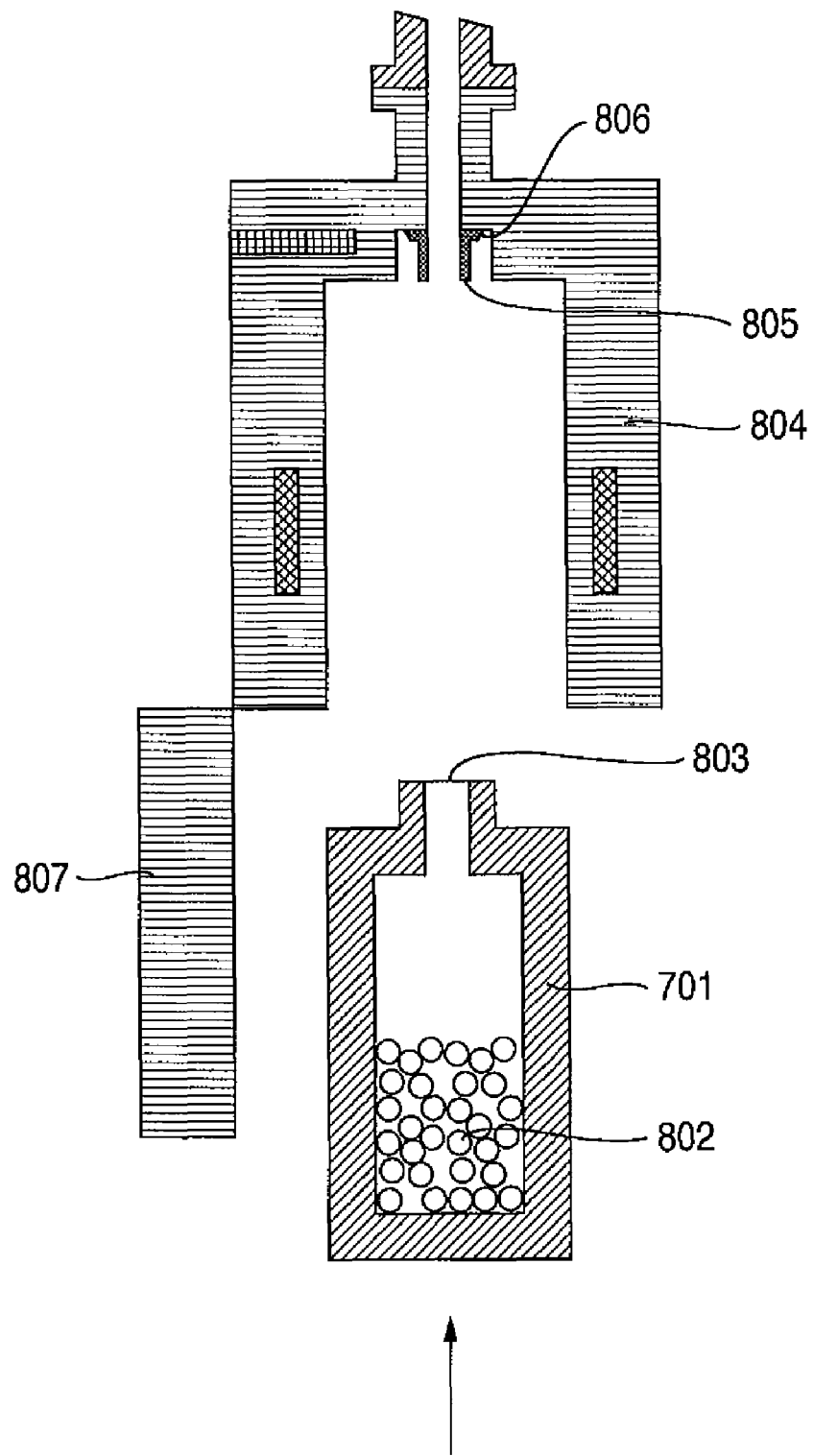
FIG. 8 is a view illustrating a way to mount the cartridge.

For the purpose of easy comprehension of the cartridge 701, FIG. 8 shows a state, in which the cartridge 701 and the cartridge holder 804 are separated from each other. The cartridge 701 comprises a body portion that stores an etch-assisting gas material 802, and a neck portion that connects the body portion and the cartridge holder 804 to each other. An opening is provided on an upper surface of the neck portion, and the opening is hermetically closed by a seal member such as a film 803, etc. The upper surface of the neck portion around the opening defines a joint surface to the cartridge holder 804 or the etch-assisting gas supplying source. Provided inside the cartridge holder 804 is a recess, into which the neck portion of the cartridge 701 is inserted, and the recess is provided with a projection 805. An O-ring 806 for vacuum sealing is provided at a root of the projection 805, that is, a bottom surface of the recess. When the cartridge 701 is inserted into the cartridge holder 804, the film 803 is torn by the projection 805. Further, the upper surface of the neck portion of the cartridge 701 and the bottom surface of the recess of the cartridge holder are vacuum-sealed by the O-ring 806. Thereby, a tube 702 in the etch-assisting gas supplying source and the cartridge 701 are coupled to each other. Finally, when the bottom cover 807 is closed, the cartridge 701 is fixed in the cartridge holder. The cartridge 701 is appropriately heated by the heater 703 and the thermo sensor 704 and gas is supplied to the tube 702. Air pressure is controlled by the valve 705 whereby ON/OFF of the gas is made. Further, a valve may be provided in the vicinity of the neck portion (toward the body portion or the cartridge holder), at which the body portion of the etch-assisting gas supplying source and the cartridge holder are connected to each other, to shield the etch-assisting gas, thereby making exhaust differentially relative to the valve 705.

Since the cartridge 701 is heated, it is preferably formed from a material of good thermal conductivity. Further, in order to store the etch-assisting gas material 802 therein, an inner wall surface of the cartridge 701 is preferably coated with a material, which is hard to react with the etch-assisting gas material.

A manner, in which the cartridge holder 804 and the cartridge are connected to each other, is not limited to the present system but may resort to fitting or screwing. In this case, while the cartridge can be fixed to the holder even without the bottom cover 807, the bottom cover is preferably provided in terms of thermal efficiency. Further, while the embodiment has been given by way of an example, in which the cartridge is shaped to comprise the neck portion and the body portion, it does not matter if the cartridge is shaped otherwise. Further, the term "etch-assisting gas supplying source" is used in the above descriptions for convenience, it goes without saying that the cartridge type mechanism described above is applicable to systems for supplying other gases than "etch-assisting gas".

As described above, the etch-assisting gas supplying source is made a cartridge type whereby it becomes not only easy to replenish a gas but also possible to quickly and readily exchange the gas for a preferable etch-assisting gas. Accordingly, the apparatus is improved in operability and fabrication of specimens is increased in throughput.

Since quick exchange of kinds of etch-assisting gases is made possible, a plurality of kinds of gases can be made to flow through one gas supplying system without an increase in stress of a user for the apparatus. Accordingly, it is possible to reduce the number of gas supplying systems required to be provided in a specimen fabricating apparatus, thus enabling manufacture of an apparatus at low cost.

In addition, while one cartridge holder is provided for the etch-assisting gas supplying source in the embodiment, the provision of a plurality of cartridge holders makes it possible to supply a plurality of kinds of gases without exchange. Both in the case where one cartridge holder is provided for the etch-assisting gas supplying source and in the case where a plurality of cartridge holders are provided, there is a possibility that when a kind of gas is replaced by another, a gas having been used remains as a contaminant in a gas path (tube). In order to eliminate the contaminant, cleaning is made by providing a device that heats the gas path, separately providing gas supplying means for flowing of inert gases, etc. through the gas path, or mounting/supplying a cartridge for inert gases.

With the use of the specimen fabricating apparatus, irregularities every material can be formed on a section by performing a processing of a hole with FIB and FIB processing while supplying a gas to a requested section as formed. Details of processing sequences will be described in subsequent embodiments.

A most simplified model will be described with respect to reactions of an etch-assisting gas with Si and $SiO_2$. First, a CF etch-assisting gas material comprises CnFm. Here, n and m are positive integers. Here, m<4n is assumed. Further, reaction products comprise $SiF_4$, $CO_2$, $O_2$, and SiC, which assume stable configurations. Among these substances, three substances, that is, $SiF_4$, $CO_2$, and $O_2$ are volatile and are extinguished by evacuation. On the other hand, SiC remains on a specimen surface. Further, it is assumed that Si and $SiO_2$ are the same in number of adsorption sites of an etch-assisting gas. Under the above assumptions, a chemical reaction formula of $SiO_2$ is as follows.

$$4nSiO_2 + 4CnFm \rightarrow mSiF_4\uparrow + 4nCO_2\uparrow + (4n-m)Si \quad (1)$$

Also, a chemical reaction formula with Si is as follows.

$$(m+4n)Si + 4CnFm \rightarrow mSiF_4\uparrow + 4nSiC \quad (2)$$

When the formula (1) and the formula (2) are standardized per reaction adsorption site in order to make a comparison between rates, at which one Si and one $SiO_2$ are removed, the formula (1) is converted into a formula (3) and the formula (2) is converted into a formula (4)

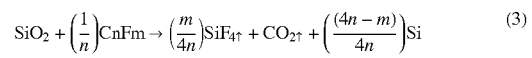

$$SiO_2 + \left(\frac{1}{n}\right)CnFm \rightarrow \left(\frac{m}{4n}\right)SiF_4\uparrow + CO_2\uparrow + \left(\frac{(4n-m)}{4n}\right)Si \quad (3)$$

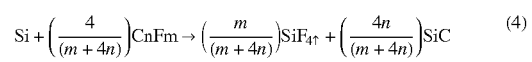

$$Si + \left(\frac{4}{(m+4n)}\right)CnFm \rightarrow \left(\frac{m}{(m+4n)}\right)SiF_4\uparrow + \left(\frac{4n}{(m+4n)}\right)SiC \quad (4)$$

That is, with $SiO_2$, what is removed from one $SiO_2$ is only a part of $SiF_4$, so that a coefficient (m/4n) in the formula (3) indicates a rate as removed. Likewise, with Si, what is removed from one Si is a part of $SiF_4$, so that a coefficient (m/(m+4n)) in the formula (4) indicates a rate as removed. Based on the results, a ratio of $SiO_2$ and Si, which are removed by the reaction, is indicated by a formula (5) where $N(SiO_2)$ and $N(Si)$, respectively, indicate removable numbers of $SiO_2$ and Si per adsorption site.

$$\frac{N(SiO_2)}{N(Si)} = \frac{\left(\frac{m}{4n}\right)}{\left(\frac{m}{(m+4n)}\right)} = \frac{(m+4n)}{4n} = 1 + \frac{m}{4n} \quad (5)$$

Therefore, it is indicated that a sputter ratio in this reaction is surely larger than 1, that is, $SiO_2$ is larger in sputter rate than Si. Further, it is found that m/n is preferably large in order to increase the sputter ratio. Further, in the case where O is contained in a CF etch-assisting gas material, in contrast to an effect that Si remains as SiC as indicated by the formula (2) and the sputter is constrained, there is a possibility that O possibly decomposes SiC and there is a fear that a sputter ratio of $SiO_2$ and Si decreases.

What is described above is a model assumed in most simplification and the model does not always react actually in this way, but it can be grasped as a tendency and so can be made use of as a search guideline for an etch-assisting gas material. Further, for adsorption of an etch-assisting gas, it is advantageously solid or liquid in a standard state to be able to adequately produce an effect of the chemical reaction. That is, it is found that an etch-assisting gas material which is solid or liquid in a standard state and does not contain O is advantageous to the section decoration. TABLE 1 indicates examples of CF gases.

TABLE 1

| No. | CHEMICAL REACTION FORMULA | STANDARD STATE | PRESENCE OR ABSENCE OF O | F/C RATIO |
|---|---|---|---|---|
| 1 | $F(CF_2)_{12}F$ | solid | ABSENT | 2.17 |
| 2 | $(CF_2)_{15}F_3N$ | liquid | ABSENT | 2.20 |
| 3 | $I(CF_2)_8I$ | solid | ABSENT | 2.00 |
| 4 | $CF_3CONH_2$ | solid | PRESENT | 1.50 |
| 5 | $CF_3COOH$ | liquid | PRESENT | 1.50 |
| 6 | $CF_3CF_2COOH$ | liquid | PRESENT | 1.67 |
| 7 | $CF_3COHCOOH$ | solid | PRESENT | 1.00 |
| 8 | $F(CF_2)_7COOH$ | solid | PRESENT | 1.88 |
| 9 | $CF_3COF$ | GASEOUS | PRESENT | 2.00 |
| 10 | $CF_3COCF_3$ | GASEOUS | PRESENT | 2.00 |
| 11 | $CF_4$ | GASEOUS | ABSENT | 4.00 |
| 12 | $C_4F_8$ | GASEOUS | ABSENT | 2.00 |
| 13 | $C_5F_8$ | GASEOUS | ABSENT | 1.60 |
| 14 | $C_3F_6$ | GASEOUS | ABSENT | 2.00 |
| 15 | $CHF_3$ | GASEOUS | ABSENT | 3.00 |

Nos. 4 to 15 among the examples represent gases already known as etch-assisting gases. It is found that No. 1, $F(CF_2)_{12}F$, which is being used in the embodiment satisfies the condition that it is solid in a standard state and does not contain O. Actually, favorable section decoration was confirmed by making an experiment with the present apparatus. Other than $F(CF_2)_{12}F$, No. 2, $(CF_2)_{15}F_3N$, which is a kind of fluorinert and No. 3, $I(CF_2)_8I$, satisfy the condition that they are solid or liquid in a standard state and do not contain O and it was confirmed that favorable section decoration is possible.

Further, a sputter ratio of 1.5 times or more is expected in an exceedingly ideal case from the formula (5) provided that m/n assumes 2 or more. Also, in this case, since adsorption of an etch-assisting gas is of course important, the condition that it is solid or liquid in a standard state and m/n is 2 or more becomes one of an efficient search guideline for an etch-assisting gas material. It is found that among the gases in TABLE 1, Nos. 1 to 3 conform to this condition and are effective in section decoration likewise as described above.

As a result of confirmation by actual experiments, in case of $F(CF_2)_{12}F$, the sputter rate of $SiO_2$ at the time of FIB etch-assisting is about 2.5 times that of Si, so that a difference in level can be readily formed by less FIB irradiation. Further, it has been confirmed by experiments that the sputter rate of No. 2, $(CF_2)_{15}F_{15}N$, in TABLE 1 which is a kind of fluorinert is about 1.9 times that of Si and the sputter rate of No. 3, $I(CF_2)_8I$, is about 1.6 times. Since these substances need less ion beam irradiation, that is, less dose, it is possible to reduce damage to a section. Further, an effect of boundary discrimination with SEM is adequately produced when a difference in level between $SiO_2$ and Si is formed to be 1 nm. In case of $F(CF_2)_{12}F$, section decoration can be made without little processing of a requested section and a section structure can be observed substantially as it is since there is only a need of processing of $SiO_2$ by 1.6 nm and Si by 0.6 nm in a direction of section depth. In this case, while sediment containing C is formed on Si, there is a need of dose of an order of magnitude larger than that in the processing at this time in order that sediment is actually accumulated to enable observation with SEM, so that such sediment has no influence on SEM observation in the processing of section decoration in the embodiment with less dose.

Further, since $F(CF_2)_{12}F$, $(CF_2)_{15}F_3N$ which is a kind of fluorinert, $I(CF_2)_8I$, etc. are solid or liquid in a standard state, they have less influences on an environment as compared with gases, and since they can be processed in a short time as described above, they have an advantage that it is possible to decrease a material consumption.

The present embodiment has illustrated an etchant material, which contains fluorine and carbon in molecules thereof and does not contain oxygen and which is solid or liquid in a standard state, or an etchant material, in molecules of which a ratio of fluorine to carbon in number is 2 or more and which is solid or liquid in a standard state. By using, for example, $F(CF_2)_{12}F$, or $(CF_2)_{15}F_3N$ which is a kind of fluorinert, or $I(CF_2)_8I$, etc. as an etchant material, it becomes possible to ensure a large difference in sputter rate to effectively fabricate a specimen, profile of which is decorated. Further, by making an etch-assisting gas supplying source an apparatus of a cartridge type construction capable of exchanging an etch-assisting material, it becomes possible to readily replenish an etch-assisting material, thus enabling efficiently fabricating a specimen.

With the use of the present specimen fabricating apparatus, it becomes possible to fabricating a section specimen which high contrast observation in a device section by SEM becomes possible.

Embodiment 2

Figure 9:
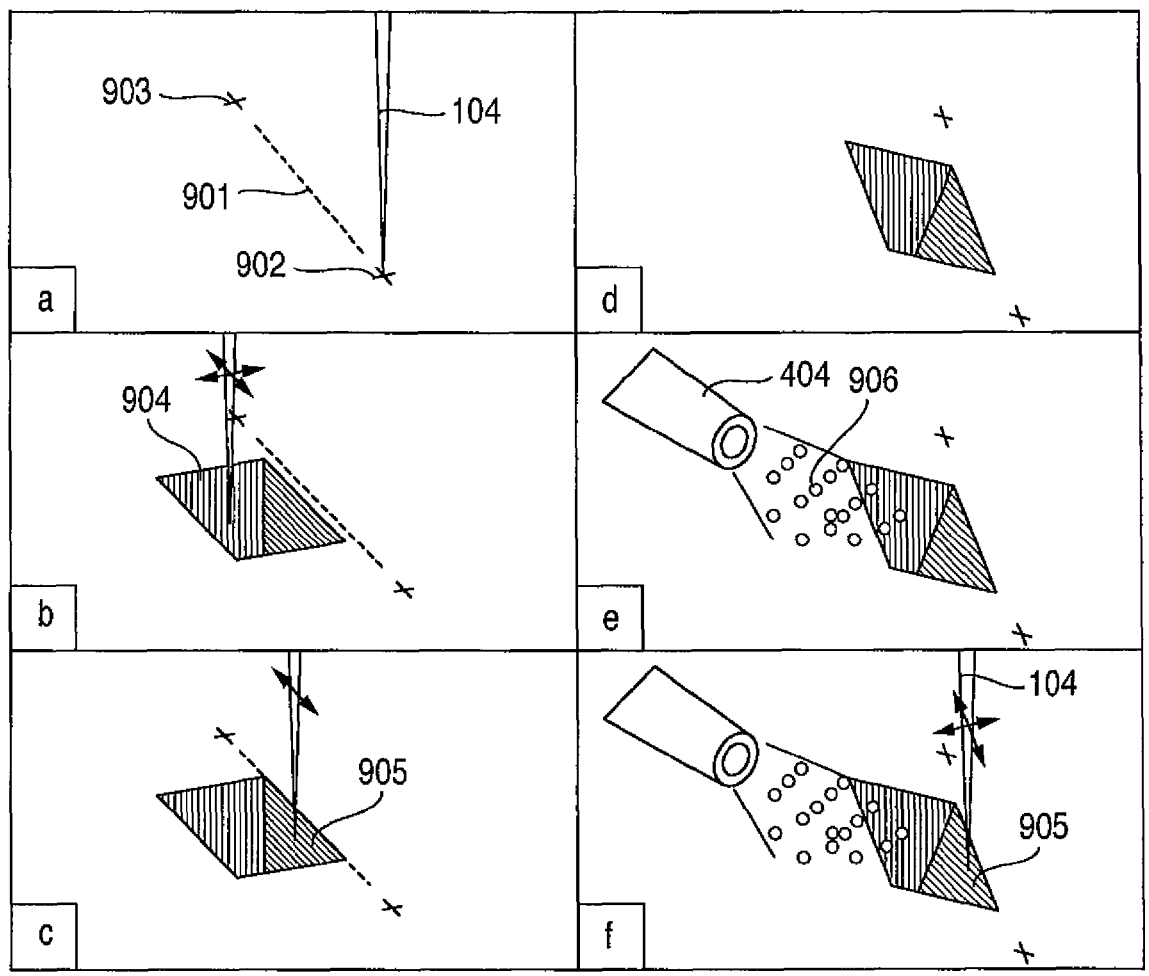
FIG. 9 is a view illustrating an example of a procedure of a specimen fabrication method according to the invention.

A method of fabricating a specimen, according to the invention, will be described. FIG. 9 illustrates flow of fabrication of a specimen. A specimen fabricating apparatus used here is the apparatus shown FIG. 1.

(a) At the outset, FIB 104 processing is used to put marks 902, 903 indicative of a position, in which a requested section 901 is fabricated.

(b) Subsequently, a rectangle, one side of which is defined by a line connecting between the marks, is set as FIB irradiation region and a hole 904 is processed by means of FIB processing. A length of a set rectangle along a requested section is determined by a region of the requested section, and a length in a direction perpendicular thereto is determined by a prospective angle of FIB irradiation at the time of section decoration described later and by a prospective angle at the time of SEM observation. At this time, since FIB actually has a finite beam diameter and beam flare or the like is involved, a processing is sometimes made over a region, for which irradiation is set. In this case, since there is a fear that the requested section disappears, it is requested that in view of influences thereby, a region of FIB irradiation be set apart a little from the marking line so as not to overlap the same at the time of hole processing. Further, a depth of hole processing is actually determined by a depth of a section structure, of which observation is requested.

(c) A side wall 905 on a side of a requested section of a rectangular-shaped hole thus fabricated is processed and reduced by means of a thin FIB in parallel to the requested section to expose the requested section 901.

(d) Subsequently, a specimen stage is inclined to enable irradiation of FIB at a certain angle on the requested section. In case of the embodiment, the specimen stage is inclined at 45 degrees so as to enable irradiation at an angle of 45 degrees to the section. Of course, the angle of inclination is not limited to 45 degrees.

(e) In this state, an etch-assisting gas material 906 is supplied to the section. As described in the embodiment, the etch-assisting gas material is supplied through the nozzle 404 by opening the valve in a state, in which the reservoir of the etch-assisting gas supplying source is heated to gasify the material. It is requested that the nozzle 404 be as close to a specimen as possible within a region free of obstruction to irradiation of FIB, because supplying is enabled at high density, consumption of the gas supplying source is small, and the specimen chamber can be maintained high in degree of vacuum.

(f) In a state, in which the etch-assisting gas is thus supplied, FIB 104 is irradiated on the requested section 905. It suffices that dose make it possible to fabricate a difference of around 1 nm in level between $SiO_2$ and Si.

In the procedure described above, it is possible to fabricate a specimen, in which a difference in level is formed every structure on the requested section. Here, while a requested region has been described as a section, whether a requested region is a flat surface in parallel to a specimen surface does not matter, and a difference in level can be also formed by irradiating FIB on an exposed flat surface while supplying the etch-assisting gas thereto in the same manner as described above. When a section of the specimen thus fabricated is observed with SEM, it is possible to obtain an image of structure observation in high contrast owing to the edge effect.

Embodiment 3

An explanation will be given to a specimen fabricating apparatus for fabricating a specimen, a section of which is to be observed, from an extracted micro-sample according to the invention.

Figure 10:
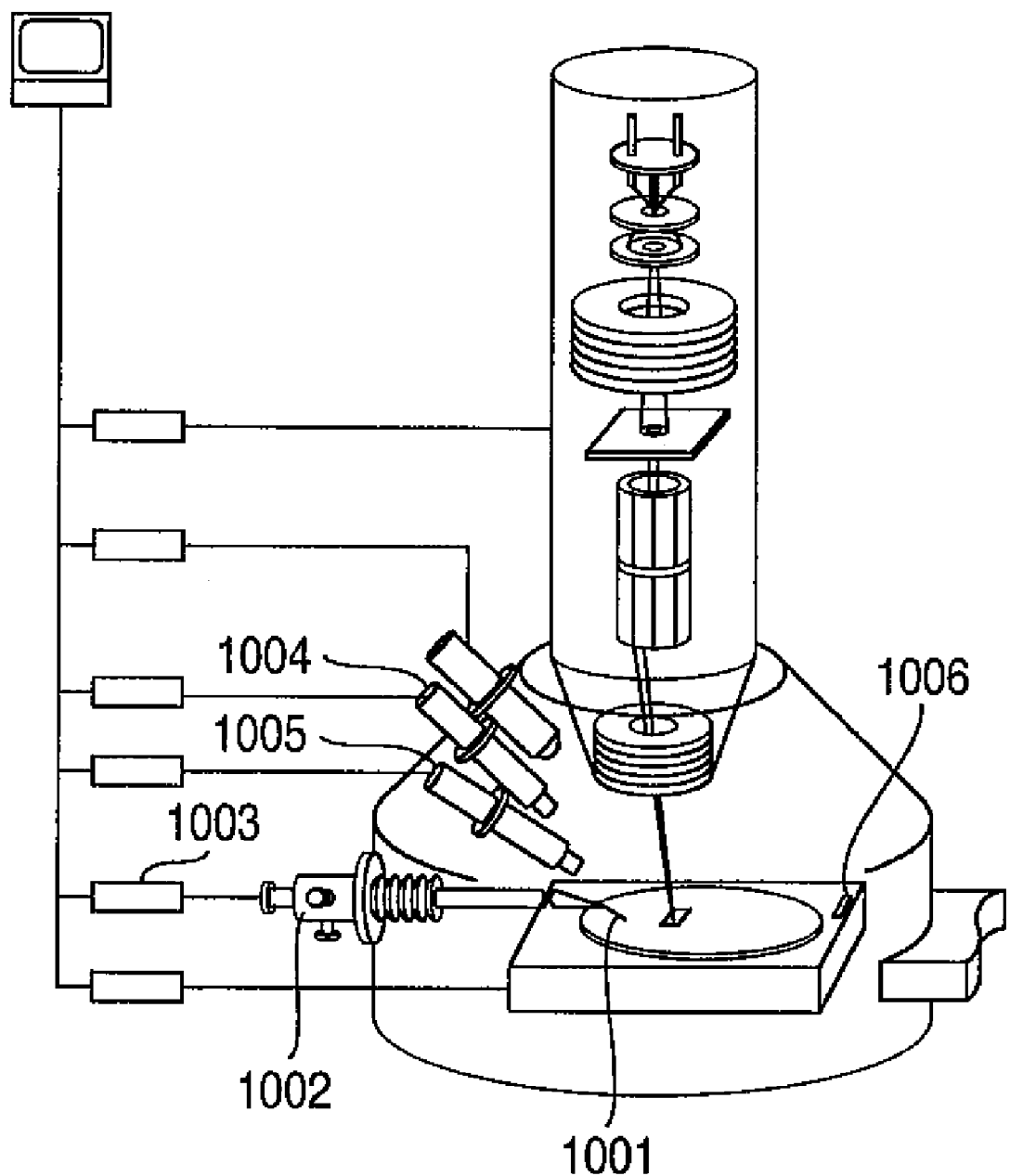
FIG. 10 is a view showing an example of a construction of a specimen fabricating apparatus, according to the invention, for decoration of a section of a micro-sample.

FIG. 10 shows a specimen fabricating apparatus functioning to extract a micro-sample. The apparatus is substantially the same in fundamental construction as the specimen fabricating apparatus in FIG. 1 but is different therefrom in having a probe 1001 for extraction of a micro-sample. The probe comprises a minute tip end having a tip end diameter in the order of submicron. In the embodiment, a tungsten probe is used. The probe 1001 can be positioned by a probe driver 1002 and a probe controller 1003. Further, the apparatus comprises a deposition-gas supplying source 1004. The supplying source is substantially the same in construction as an etch-assisting gas supplying source 1005 but what is stored therein is a deposition-gas. In the embodiment, tungsten carbonyl ($W(CO)_6$) is used as the deposition-gas material but the material is not limited thereto. Further, the apparatus comprises a sample-carrier holder 1006 that places thereon a sample-carrier for fixation of an extracted micro-sample.

Figure 11:
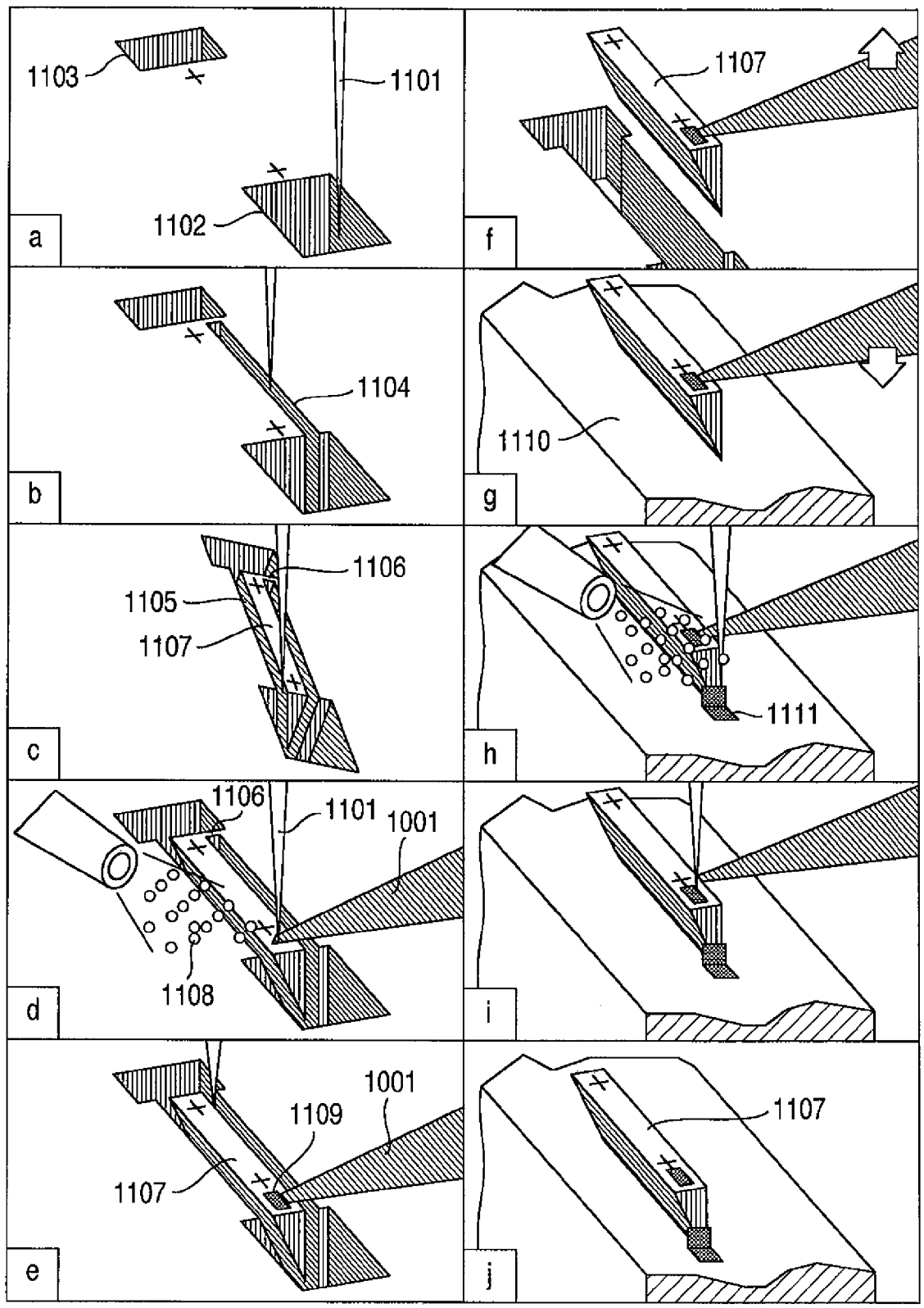
FIG. 11 is a view illustrating a procedure of a processing of a micro-sample according to the invention.

FIG. 11 illustrates a method of fabricating a specimen with the use of the apparatus.

(a), (b) At the outset, FIB 1101 is used to process three rectangular holes 1102, 1103, 1104 along three sides around a requested section.

(c) Subsequently, a micro-sample 1107 supported on an original sample only by a residual area 1106 can be fabricated by inclining a specimen stage and processing a trench 1105.

(d) Subsequently, the specimen stage is returned to an original position from the inclined position and the probe driver 1002 brings a tip end of the probe 1001 into contact with the micro-sample 1107. Subsequently, FIB 1101 is irradiated on a region including the tip end of the probe while a deposition-gas 1108 is supplied from the deposition-gas supplying source 1004, whereby a deposition film 1109 (W film in the embodiment) can be formed and (e) the micro-sample 1107 and the probe 1001 can be fixed together.

Thereafter, the micro-sample can be separated from the original sample by removing the residual area 1106 by means of FIB processing (f), (g).

The micro-sample 1107 thus separated is brought into contact with a sample-carrier 1110 by driving of the probe (h).

The micro-sample and the sample-carrier are fixed together by forming a deposition film 1111 on the contact in the same way as described above (i).

Thereafter, the tip end of the probe is subjected to FIB processing to achieve separation of the probe whereby the micro-sample 1107 can be made independent.

Subsequently, fabrication of a section will be described with reference to FIG. 12.

(a), (b) FIB 1101 is irradiated in parallel to a requested section to perform a processing so as to expose the requested section 1201.

(c) Finally, the sample-carrier holder is inclined to enable irradiation of FIB at a certain angle on the requested section.

In the embodiment, nothing obstructs in front of the requested section unlike the case where one surface of the hole is made the requested section as in Embodiment 1, so that it is possible to irradiate FIB perpendicularly to the requested section (d), (e).

A specimen, the requested section of which is decorated, can be fabricated by irradiating FIB 1101 in this posture to perform etch-assisting while supplying an etch-assisting gas 1202. The specimen thus fabricated can be observed in higher contrast than that in case of Embodiment 1. The reason for this is that since a section to be observed in Embodiment 1 is present in the hole, it is hard to take secondary electrons into the detector at the time of SEM observation and yield is poor. In contrast, since nothing obstructs in front of the requested section fabricated in the present embodiment, it is possible to efficiently detect secondary electrons to make observation in high contrast. Further, while an angle of SEM observation corresponds to oblique looking-into in Embodiment 1, observation from a vertical is enabled in the present embodiment. Thereby, since observation of an aspect ratio in actual size is enabled, it is possible to increase the resolving power especially in a longitudinal direction. Further, since primary electrons of SEM invade an interior of a section to some extent depending upon acceleration voltage, detection of secondary electrons makes estimated information in a region of invasion. With a semiconductor device to be observed, estimation in a direction perpendicular to a section does not cause an important problem since the structure is the same in a shallow region, but it is necessary to pay attention to understanding of a structure from an observed image since information is estimated in an oblique direction in the case where observation is made in oblique entrance as in Embodiment 1. In contrast, the present embodiment, which affords vertical observation, has an advantage that less care suffices.

By using the specimen fabricating apparatus according to the present embodiment, it is possible to fabricate a specimen, which enables SEM observation from a vertical and of which a section is decorated.

Embodiment 4

In the present embodiment, an explanation will be given to a FIB-SEM apparatus that affords SEM observation on the spot after a section is fabricated by FIB etch-assisting.

Figure 13:
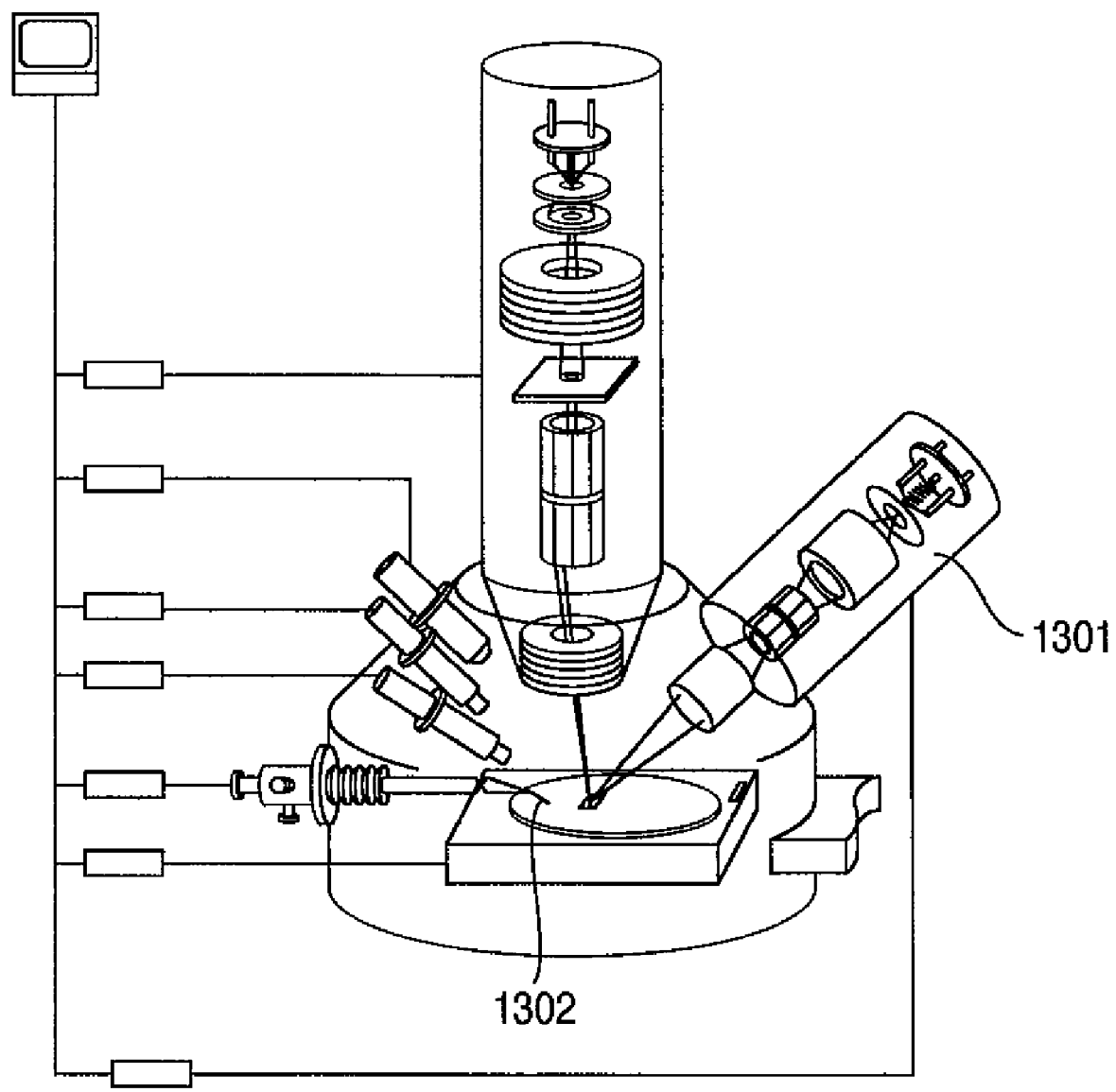
FIG. 13 is a view showing an example of a construction of a FIB-SEM apparatus according to the invention.

FIG. 13 shows a construction of a FIB-SEM apparatus. The present apparatus is the same in fundamental construction as the specimen fabricating apparatus shown in FIGS. 1 and 10 but the present apparatus differs therefrom in that a scanning electron beam irradiating optical system 1301 is installed in the same specimen chamber. The SEM is obliquely provided relative to a specimen stage. This is because a section fabricated is made easy to observe without inclining the specimen stage and a section being subjected to FIB processing can be monitored by SEM at the time of formation of a requested section. Thereby, SEM observation can be made without exposing a specimen, a section of which is decorated, to the atmosphere and an observed image of a section with high reliability can be obtained without care for contamination in the atmosphere. Further, since observation can be made on the same spot without movement to a separate SEM apparatus, there is an advantage that time for analysis is shortened. Further, since a section being subjected to FIB processing can be monitored by SEM at the time of formation of a requested section, it becomes also possible to fabricate a requested section in a further correct position.

Further, with the present apparatus, FIB irradiation for etch-assisting can be made perpendicularly to a requested section and SEM observation can be made even when a micro-sample is not transferred to a sample carrier as in Embodiment 3. The reason for this is that since a probe 1302 is provided to be able to extract a micro-sample in the same manner as in Embodiment 3 and a probe rotating mechanism is provided, it is possible to incline a micro-sample fixedly left on the probe and to arrange a requested section perpendicularly to FIB and SEM.

Figure 14:
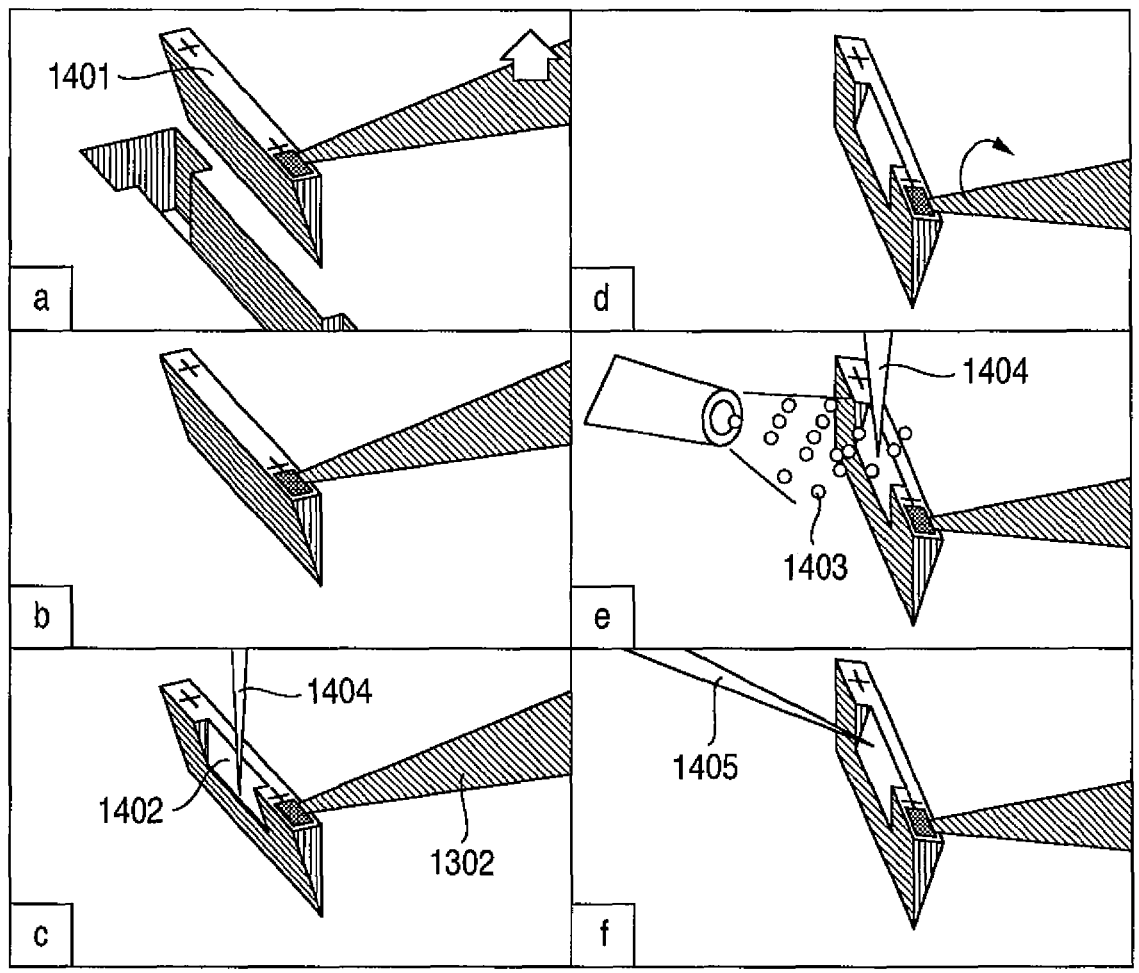
FIG. 14 is a view illustrating a method for decoration of a section of an extracted micro-sample according to the invention.

This method will be described with reference to FIG. 14.

Figure 12:
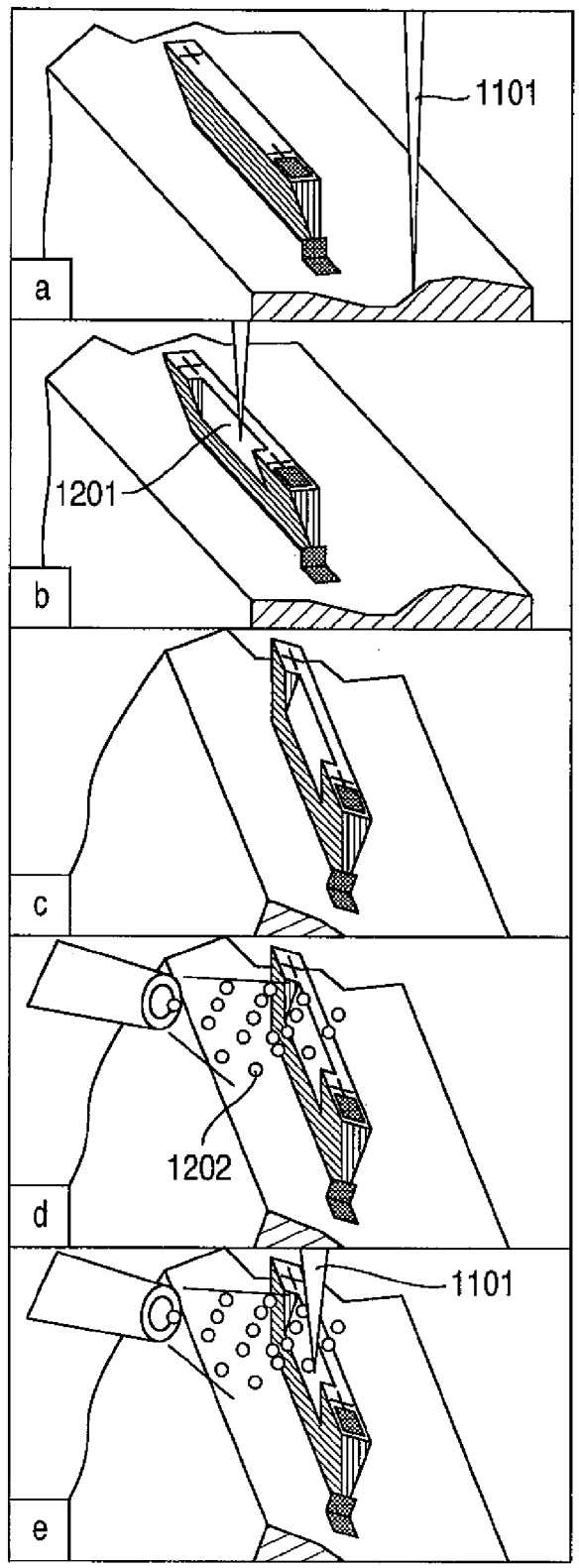
FIG. 12 is a view illustrating a procedure for decoration of a section of a micro-sample according to the invention.

(a), (b) The procedure up to extraction of a micro-sample 1401 is the same as that shown in FIG. 12.

(c) A requested section 1402 while being fixed by the probe 1302 is processed by means of FIB 1404.

(d) Thereafter, the probe 1302 is inclined.

(e) Subsequently, a specimen with a section thereof decorated can be fabricated by irradiation of FIB 1404 while an etch-assisting gas 1403 is supplied. In this state, it is possible to irradiate FIB 1404 and to make SEM observation.

With the use of FIB-SEM according to the present embodiment, it is possible to realize observation of a section in a short time and with a further high reliability.

Embodiment 5

In the present embodiment, an explanation will be given to a FIB-SEM apparatus that affords SEM observation on the spot after a section is fabricated by FIB etch-assisting and comprises an inclined ion-beam irradiating optical system.

Figure 15:
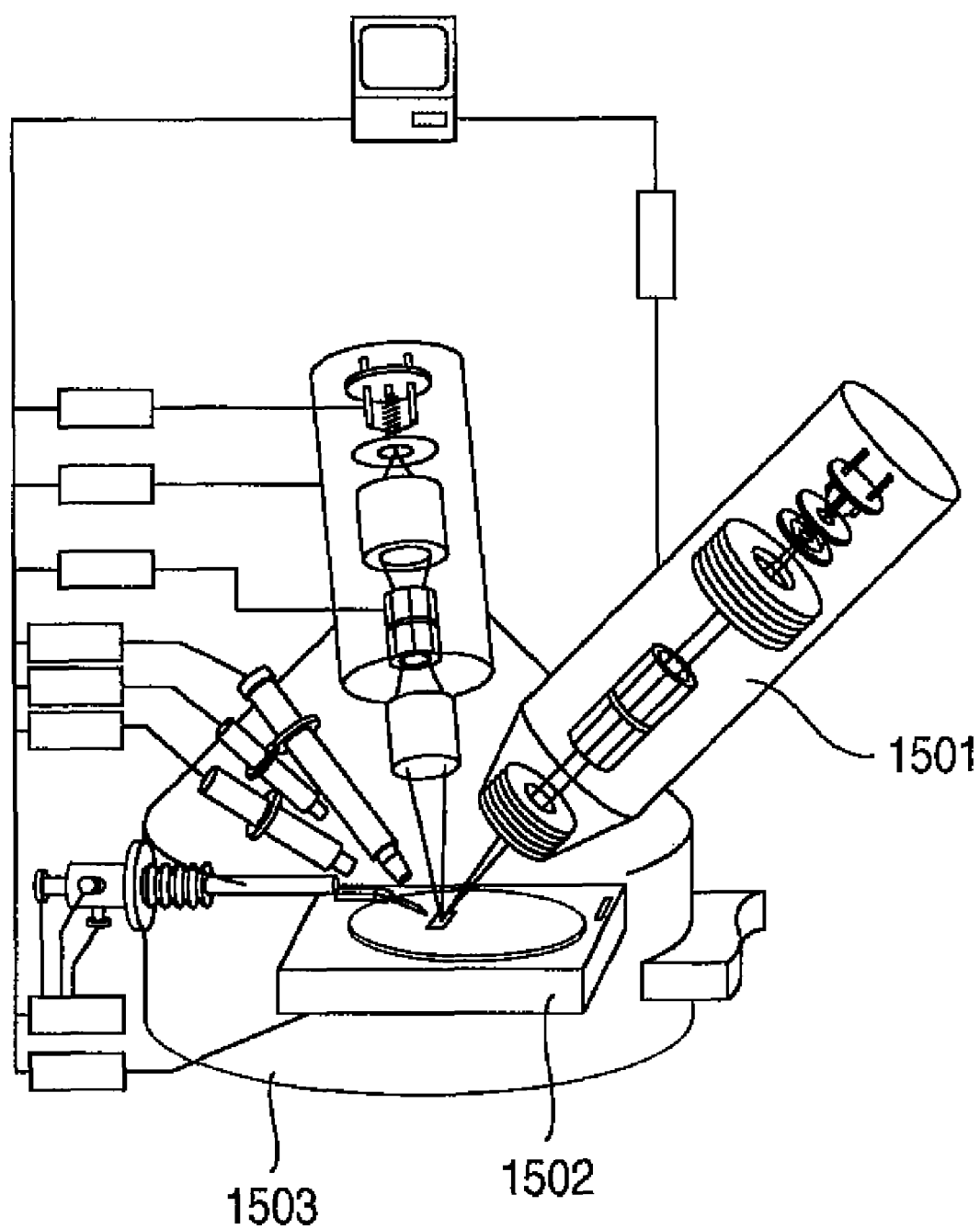
FIG. 15 is a view showing an example of a construction of a FIB-SEM apparatus, according to the invention, with a non-inclined specimen stage.

FIG. 15 shows a construction of the FIB-SEM apparatus comprising an inclined ion-beam irradiating optical system 1501. A large difference in construction between the apparatus and the FIB-SEM apparatus, according to Embodiment 4, shown in FIG. 13 is that a specimen stage 1502 is not inclined. Thereby, the mechanism for the specimen stage is made simple and an area required for a specimen chamber 1503 can be substantially decreased in an apparatus conformed to a wafer having, for example, φ300 mm, so that the construction is advantageous in terms of cost and positional accuracy. In this case, however, when the FIB optical system is mounted perpendicularly to a specimen surface as in FIG. 13, a processing of a hole for exposure of a requested section is possible but FIB irradiation for etch-assisting for decoration of a section cannot be made at a certain angle to a requested section. Therefore, the construction comprises the ion-beam irradiating optical system 1501 inclined relative to a specimen surface as shown in FIG. 15. While an angle of inclination is optional, an inclination of, for example, 30 degrees is adopted in the present embodiment.

Figure 16A:
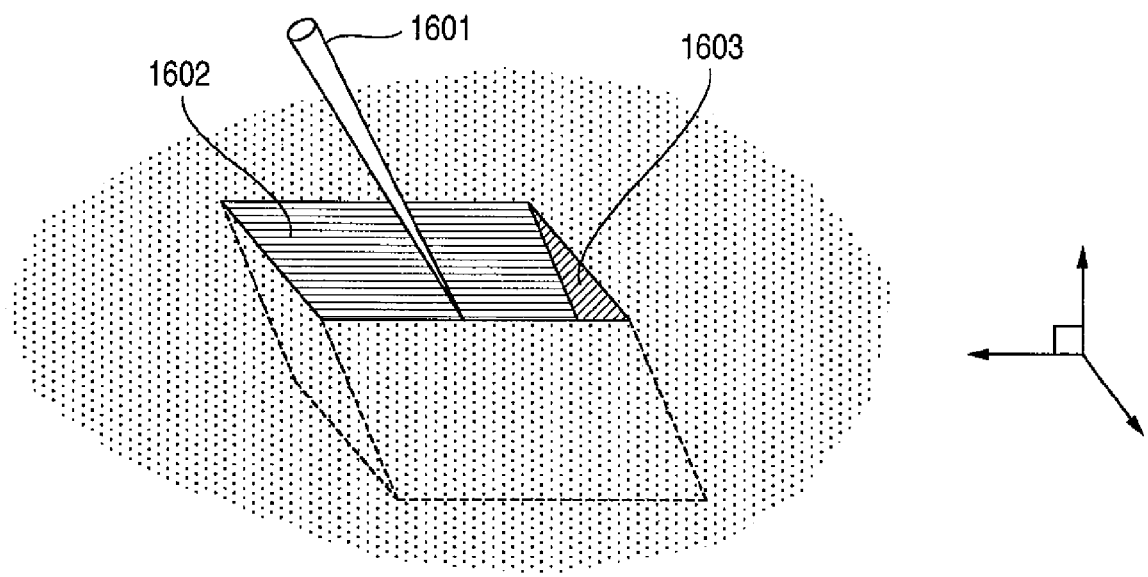
FIGS. 16A and 16B are views illustrating a procedure of a processing for decoration of a section, according to the invention, with the use of the non-inclined specimen stage.
Figure 16B:
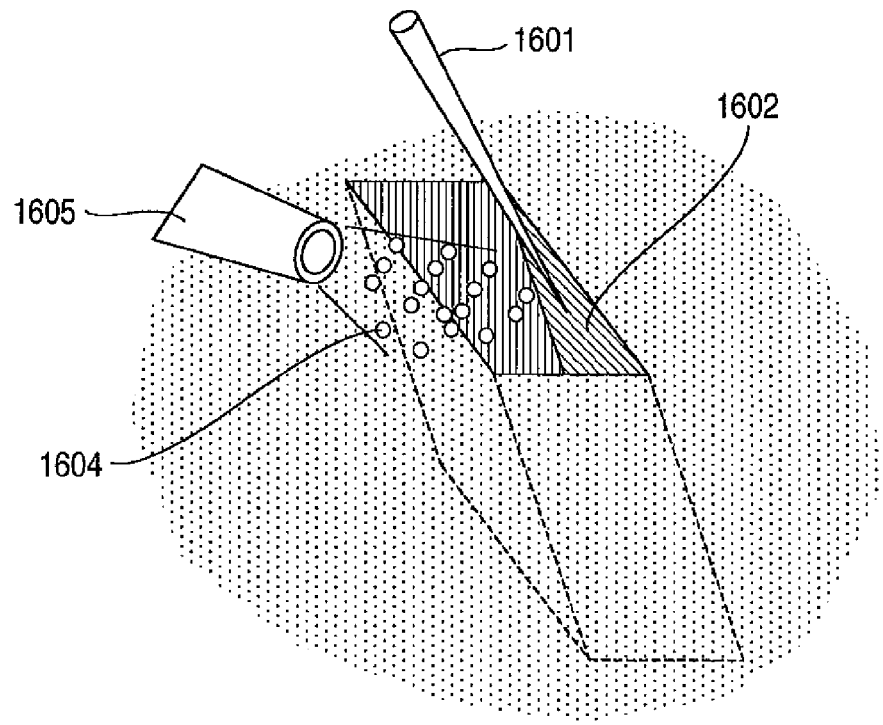

Fabrication of a specimen with the use of the apparatus and a method of observing a section will be described with reference to FIG. 16.

(a) First, a rectangular region, one side of which is defined by a requested section 1602, is set in order to expose the requested section, and irradiation of FIB 1601 is made. At this time, adjustment is accomplished by rotating the specimen stage so as to make the requested section be in parallel to a direction, in which the FIB optical system is inclined. Actually, as described with respect to Embodiment 2, a processed region is set apart a little from a position of the actual requested section so as not to include the position of the requested section. FIB processing in a rectangular shape can fabricate a processed hole 1603 in the form of a parallelogram as shown in the drawing, and a surface of the parallelogram is in parallel to the requested section. Successively, the requested section is processed and reduced by means of a thin FIB with the positional relationship as it is, and thus the requested section 1602 is exposed.

(b) Thereafter, setting is accomplished by rotating the specimen stage by 90 degrees to enable irradiation of FIB 1601 on the requested section 1602. With the ion-beam optical system, which is inclined by 30 degrees, according to the present embodiment, FIB is irradiated at 60 degrees on the requested section. Section decoration is enabled by irradiating FIB 1601 in this state while supplying an etch-assisting gas 1604 to the requested section 1602 from a nozzle 1605 in the same manner as in the embodiment described above. Thereafter, the specimen stage is rotated back by 90 degrees to afford SEM observation of the decorated requested section 1602.

The present apparatus can also be provided with a probe, extraction of a micro-sample becomes possible as in the Embodiments 3 and 4, and the same effect as that in the latter is expected.

FIB-SEM in the present embodiment is used to enable decoration of a section by means of etch-assisting also in an apparatus without a mechanism for inclining a specimen stage.

Embodiment 6

In the present embodiment, an explanation will be given to section decoration by etch-assisting with the use of a projection type ion-beam apparatus (referred below to as PJIB).

Figure 17:
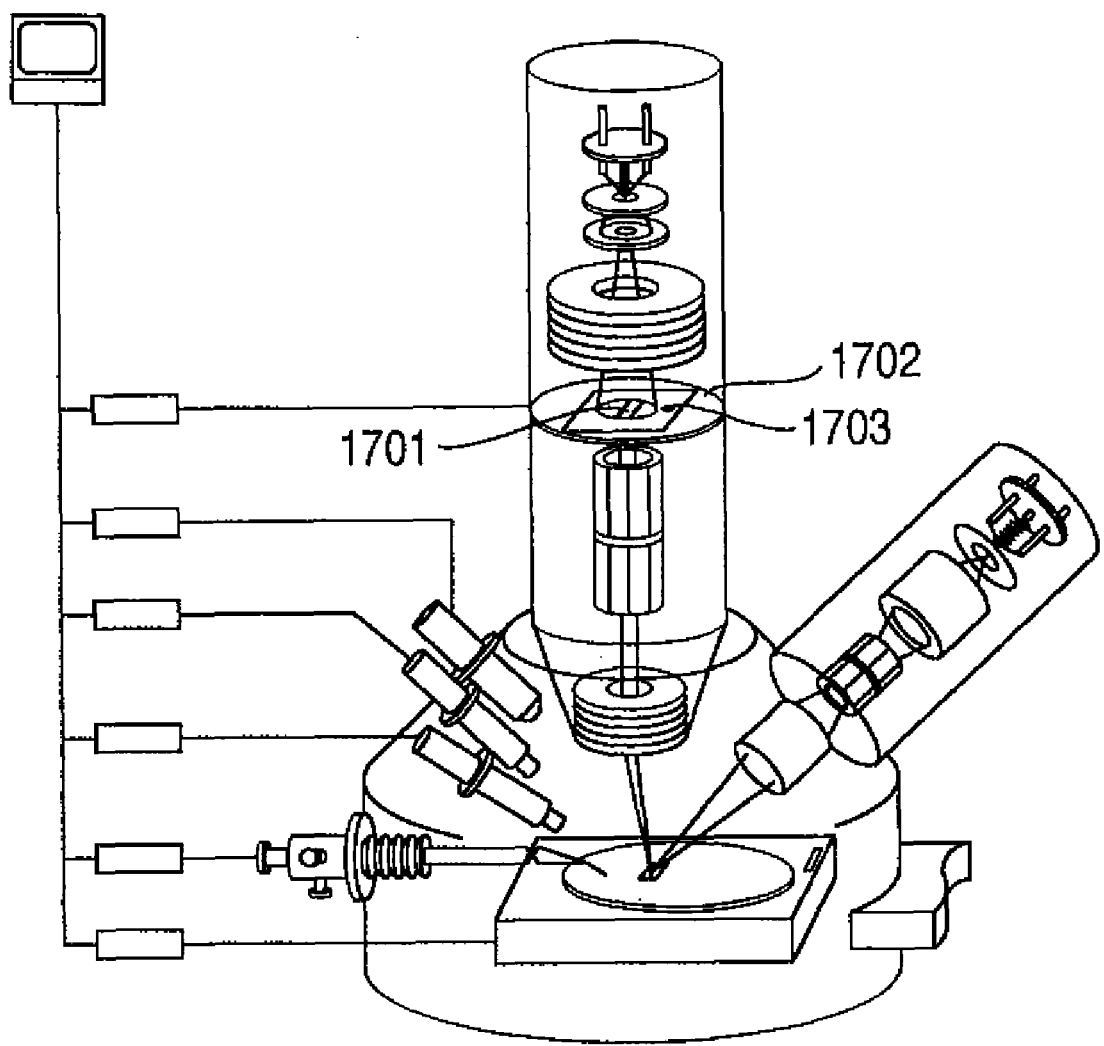
FIG. 17 is a view showing an example of a construction of a PJIB apparatus according to the invention.

FIG. 17 shows the PJIB apparatus. A projection mask 1702 capable of projecting a requested rectangular shape 1701 is selected and irradiation enables processing a rectangular hole. A difference to FIB is that no scanning is made owing to batch irradiation. Thereby, a large current processing becomes possible and a short time processing is realized. Of course, it is also possible to form a rectangular beam smaller than a requested rectangle and to perform scanning with such rectangular beam to form a target rectangular hole. Also in this case, a processing in a shorter time than that with FIB is enabled.

An ion beam is irradiated on a requested section thus formed while an etch-assisting gas is supplied thereto, but there is a problem. In case of FIB, irradiation on the whole section is performed by basically exercising deflective control of a spot beam, and for a minute region corresponding to a FIB spot diameter, dead time corresponding to one frame of deflective scanning passes away until FIB is subsequently irradiated after FIB is once irradiated. During the time, the etch-assisting gas can be adsorbed. In case of PJIB, however, when batch irradiation is performed on a requested section, an ion beam is constantly irradiated on the requested section during the irradiation, so that it is not possible to gain time, during which an etch-assisting gas is adsorbed. In this case, a sufficient chemical reaction does not take place and physical sputtering becomes a main sputtering, so that a requested difference in sputtering rate cannot be obtained every material in a section structure and section decoration cannot be made efficiently. Therefore, also in case of the PJIB apparatus, etch-assisting is made possible by simulatively forming FIB. That is, FIB can be formed by inserting a pinhole aperture 1703 midway a PJIB optical system and forming a minute beam to perform scanning with a deflector. While a large current of PJIB is effective in hole processing in order to lessen a processing time, restriction of beam with the pinhole aperture does not cause a problem since a minute current is sufficient for an irradiation beam for etch-assisting used in section decoration. Thereby, section decoration can be realized by performing scanning and irradiation with a minute beam while supplying an etch-assisting gas in the same manner as in the embodiment described above. Also, decoration of a section can be accommodated by making a non-irradiation time with a blanker so that the gas is adsorbed.

Further, in the present embodiment, a processing with a large current becomes possible also in case of argon beam, which becomes small in current density when used as FIB, and therefore, manufacture in non-contamination like this can be realized, so that it becomes possible to return a wafer after analysis to a semiconductor manufacturing process. Further, influences on a subsequent semiconductor manufacturing process can also be suppressed by filling the processed hole with, for example, a deposition film, etc. to return the same to the processing.

With the PJIB apparatus according to the present embodiment, a high-speed hole processing is possible, so that it is possible to lessen time for analysis. Further, since a section for observation in non-contamination can be fabricated and influences on the semiconductor manufacturing process can be made small, in-line analysis becomes possible.

Embodiment 7

In the present embodiment, an explanation will be given to section decoration with the use of an electron beam.

Figure 18:
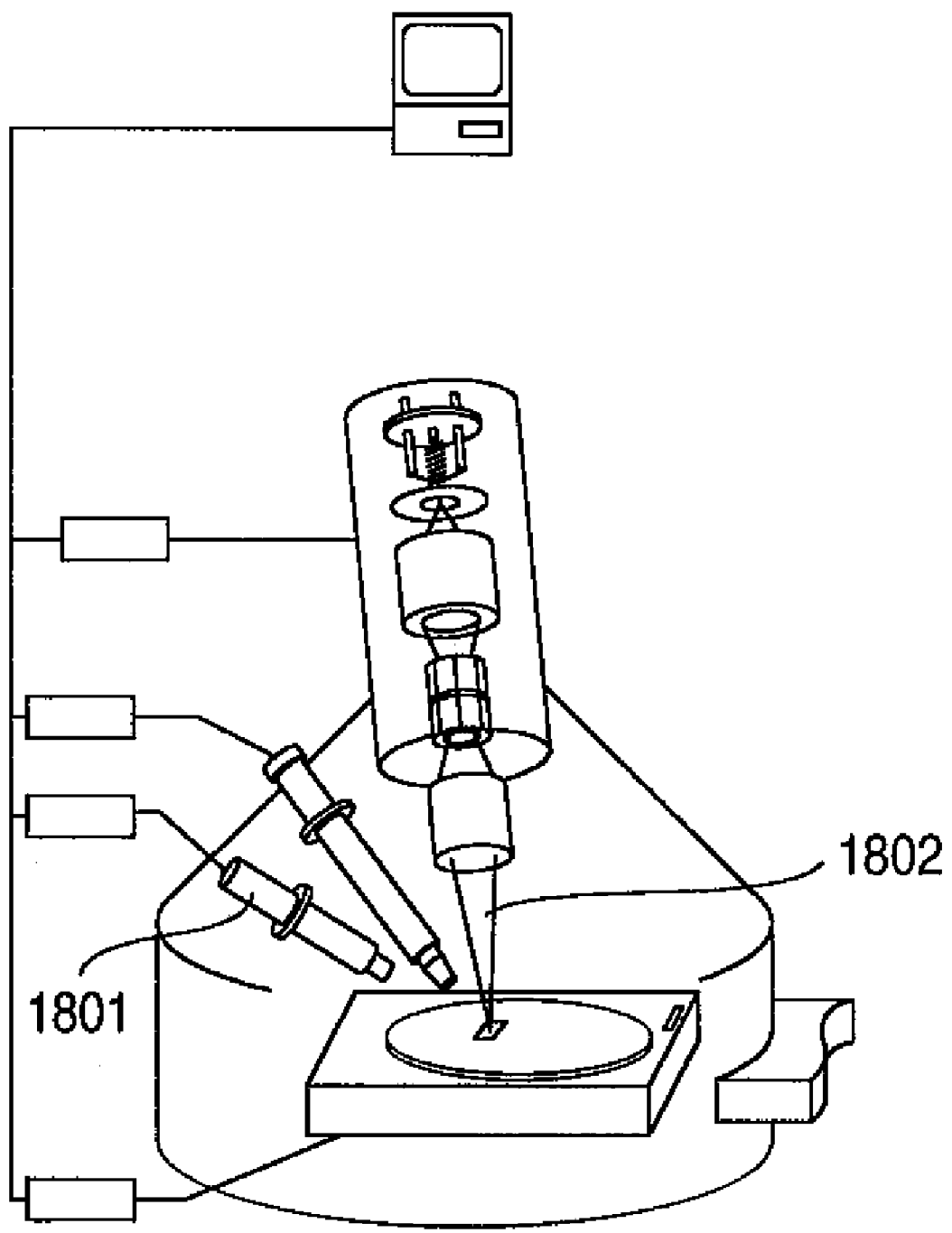
FIG. 18 is a view showing an example of a construction of an electron beam apparatus according to the invention.

FIG. 18 shows an electron beam apparatus. While the apparatus is the same in fundamental construction as SEM but difference is that an etch-assisting gas supplying source 1801 is mounted. Also with an electron beam 1802, a processing is enabled by the use of an etch-assisting gas. While a processing for exposure of a requested section is not impossible with the etch-assisting gas and irradiation of electron beam, the electron beam is not practical since electron is small in mass as compared with ion and an electron beam is extremely small in sputtering rate as compared with an ion beam. Therefore, in case of an independent electron beam apparatus as in the present embodiment, it is preferable to introduce a specimen, a requested section of which is exposed by a separate processing apparatus. The electron beam 1802 is irradiated to the section while supplying thereto an etch-assisting gas such as perfluorododecane, etc. from a nozzle. As described above, while the processing speed is small as compared with an ion beam, a difference in irregularities every material, which is as small as 1 nm, is effective for a requested section, for which section decoration is necessary, so that section decoration can be realized even with an electron beam. In particular, since an electron beam is negligibly small in physical sputtering, the reaction is almost purely composed of chemical etchant to enable sputtering further relying on a material. Therefore, it is possible to realize decoration of a minute section with lower damage. The section thus fabricated can be observed with the SEM function of the present apparatus.

Further, since section decoration is possible even with an electron beam, it is also possible in FIB-SEM illustrated in the Embodiments 4 and 5 to make use of an electron beam of SEM for an etch-assisting section processing after the processing of a hole. A processing for decoration of a further minute section is made possible by the use of the electron beam etch-assisting apparatus according to the present embodiment.

Since the invention produces an effect in examination and analysis of a semiconductor processing, it can be made use of for an improvement in yield in semiconductor manufacturing companies to contribute much to reduction in cost, or the like.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A specimen fabricating apparatus comprising:
  a specimen stage on which a specimen is placed;
  a charged particle beam optical system to irradiate a charged particle beam onto the specimen;
  a probe to extract a micro-sample separated from the specimen by irradiating the charged particle beam onto the specimen; and
  an etchant material supplying source to supply an etchant material, which contains fluorine and carbon in molecules thereof, does not contain oxygen in molecules thereof, and is a solid or a liquid in a standard state.

2. The specimen fabricating apparatus according to claim 1, further comprising a sample-carrier on which the micro-sample is placed, and a unit for inclining the sample-carrier.

3. The specimen fabricating apparatus according to claim 1, wherein the etchant material is $F(CF_2)_{12}F$, $(CF_2)_{15}F_3N$, or $I(CF_2)_8I$.

4. The specimen fabricating apparatus according to claim 1, wherein the etchant material supplying source has a cartridge type construction which enables exchange of the etchant material.

5. The specimen fabricating apparatus according to claim 4, further comprising a cartridge holder to fix the cartridge, and wherein the cartridge holder comprises means to heat the cartridge.

6. A specimen fabricating apparatus comprising:
  a specimen stage on which a specimen is placed;
  a charged particle beam optical system to irradiate a charged particle beam onto a specimen;
  a probe to extract a micro-sample separated from the specimen by irradiating the charged particle beam onto the specimen; and
  an etchant material supplying source to supply an etchant material, in molecules of which a ratio of fluorine to carbon in number is 2 or more and which is a solid or a liquid in a standard state, to the specimen.

7. The specimen fabricating apparatus according to claim 6, further comprising a sample carrier on which the micro-sample is placed, and a unit for inclining the sample-carrier.

8. The specimen fabricating apparatus according to claim 6, wherein the etchant material is $F(CF_2)_{12}F$, $(CF_2)_{15}F_3N$, or $I(CF_2)_8I$.

9. A specimen fabricating apparatus comprising:
a specimen stage on which a specimen is placed;
an ion-beam irradiating optical system to irradiate an ion-beam, onto the specimen;
an electron beam irradiating optical system to irradiate an electron beam onto the specimen;
an etchant material supplying source to supply an etchant material, which contains fluorine and carbon in molecules thereof, does not contain oxygen in molecules thereof, and is a solid or a liquid in a standard state; and
a vacuum chamber to house the specimen stage, the ion-beam irradiating optical system and the electron beam irradiating optical system.

10. The specimen fabricating apparatus according to claim 9, wherein the electron beam irradiating optical system is obliquely provided relative to the specimen stage.

11. The specimen fabricating apparatus according to claim 9, further comprising a probe to extract a micro-sample separated from the specimen by irradiating the ion-beam on the specimen and a probe rotating mechanism to rotate the probe.

12. The specimen fabricating apparatus according to claim 9, wherein the etchant material is composed of molecules, of which a ratio of fluorine to carbon in number is 2 or more, and is a solid or a liquid in a standard state.

13. The specimen fabricating apparatus according to claim 9, wherein the etchant material is $F(CF_2)_{12}F$, $(CF_2)_{15}F_3N$, or $I(CF_2)_8I$.

14. A specimen fabricating apparatus comprising:
a specimen stage on which a specimen is placed;
an ion-beam irradiating optical system to irradiate an ion-beam onto the specimen;
a probe to extract a micro-sample separated from the specimen by irradiating the ion-beam onto the specimen;
an electron beam irradiating optical system to irradiate an electron beam onto the micro-sample;
an etchant material supplying source to supply an etchant material for decorating a section of the micro-sample; and
a vacuum chamber to house the specimen stage, the ion-beam irradiating optical system and the electron beam irradiating optical system,
wherein the etchant material is composed of molecules, of which a ratio of fluorine to carbon in number is 2 or more, and is a solid or a liquid in a standard state.

15. The specimen fabricating apparatus according to claim 14, wherein the electron beam irradiating optical system can irradiate the electron beam on the micro-sample perpendicularly to the section.

16. The specimen fabricating apparatus according to claim 14, further comprising a probe rotating mechanism to rotate the probe.

17. The specimen fabricating apparatus according to claim 14, wherein the etchant material contains fluorine and carbon in molecules thereof, does not contain oxygen in molecules thereof, and is a solid or a liquid in a standard state.

* * * * *

UNITED STATES PATENT AND TRADEMARK OFFICE
CERTIFICATE OF CORRECTION

| | | |
|---|---|---|
| PATENT NO. | : 7,989,782 B2 | Page 1 of 1 |
| APPLICATION NO. | : 12/354153 | |
| DATED | : August 2, 2011 | |
| INVENTOR(S) | : Satoshi Tomimatsu et al. | |

It is certified that error appears in the above-identified patent and that said Letters Patent is hereby corrected as shown below:

ON THE TITLE PAGE

Correct (*) Notice to read:

Subject to any disclaimer, the term of this patent is extended or adjusted under 35 U.S.C. 154(b) by 263 days.

--This patent is subject to a terminal disclaimer.--

Signed and Sealed this
First Day of November, 2011

David J. Kappos
*Director of the United States Patent and Trademark Office*